US012663709B2

(12) United States Patent
Hsu et al.

(10) Patent No.: US 12,663,709 B2
(45) Date of Patent: Jun. 23, 2026

(54) PELLICLE AND METHOD OF MANUFACTURING THEREOF

(71) Applicant: TAIWAN SEMICONDUCTOR MANUFACTURING COMPANY, LTD., Hsinchu (TW)

(72) Inventors: Pei-Cheng Hsu, Hsinchu (TW);
Hsin-Chang Lee, Hsinchu (TW);
Huan-Ling Lee, Hsinchu (TW);
Chin-Hsiang Lin, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 559 days.

(21) Appl. No.: 18/133,937

(22) Filed: Apr. 12, 2023

(65) Prior Publication Data

US 2024/0345471 A1     Oct. 17, 2024

(51) Int. Cl.
*G03F 1/64*          (2012.01)

(52) U.S. Cl.
CPC ...................................... *G03F 1/64* (2013.01)

(58) Field of Classification Search
CPC ...................................... G03F 1/64; G03F 1/62
USPC ............................................................. 430/5
See application file for complete search history.

(56) References Cited

U.S. PATENT DOCUMENTS

| | | | |
|---|---|---|---|
| 2017/0038676 A1* | 2/2017 | Jung | G03F 1/62 |
| 2020/0096880 A1 | 3/2020 | Nikipelov et al. | |
| 2021/0191255 A1* | 6/2021 | Timmermans | G03F 1/62 |
| 2022/0260932 A1 | 8/2022 | Hsu et al. | |
| 2022/0276553 A1 | 9/2022 | Nikipelov et al. | |
| 2023/0341764 A1 | 10/2023 | Lima et al. | |
| 2024/0248391 A1* | 7/2024 | Knisley | G03F 1/62 |

FOREIGN PATENT DOCUMENTS

| | | |
|---|---|---|
| TW | 202117441 A | 5/2021 |
| TW | 202216589 A | 5/2022 |
| TW | 202240312 A | 10/2022 |

* cited by examiner

*Primary Examiner* — Caleen O Sullivan
(74) *Attorney, Agent, or Firm* — STUDEBAKER BRACKETT PLLC

(57)          ABSTRACT

A pellicle for an EUV photo mask includes a membrane attached to a frame. The membrane includes nanotubes, Ru—O—X catalyst structures partially covering a surface of each nanotube, and a protection layer to cover the Ru—O—X catalyst structures and the surface of each nanotube. X is a metal element of Mo, Ti, Zr or Nb. The Ru—O—X catalyst structures include first nano-particles of a X-containing material formed on the surface of each nanotube, and second nano-particles of a Ru-containing material formed on the first nano-particles, thereby forming catalysts or catalyst bridges. The pellicle advantageously has high EUV light transmittance and improved endurance against attacking particles (such as hydrogen particles), thereby having prolonged lifetime.

20 Claims, 20 Drawing Sheets

10M 230
220
210

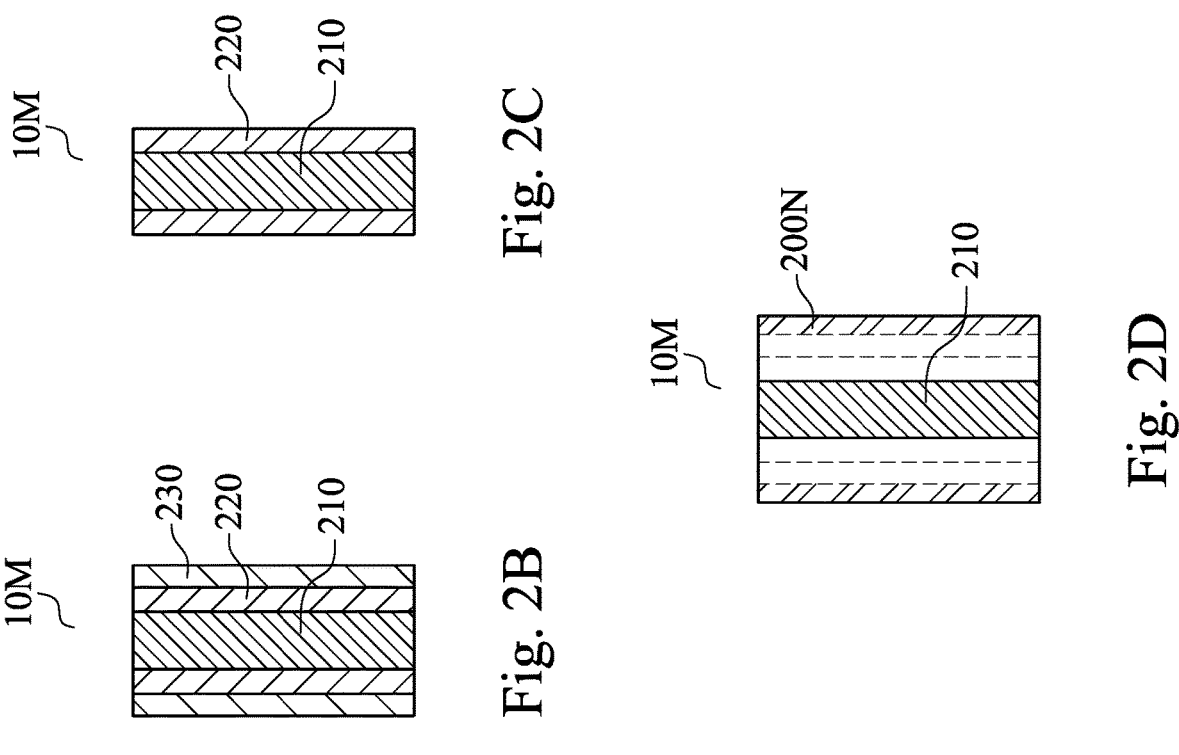
Fig. 2C
Fig. 2B
Fig. 2D
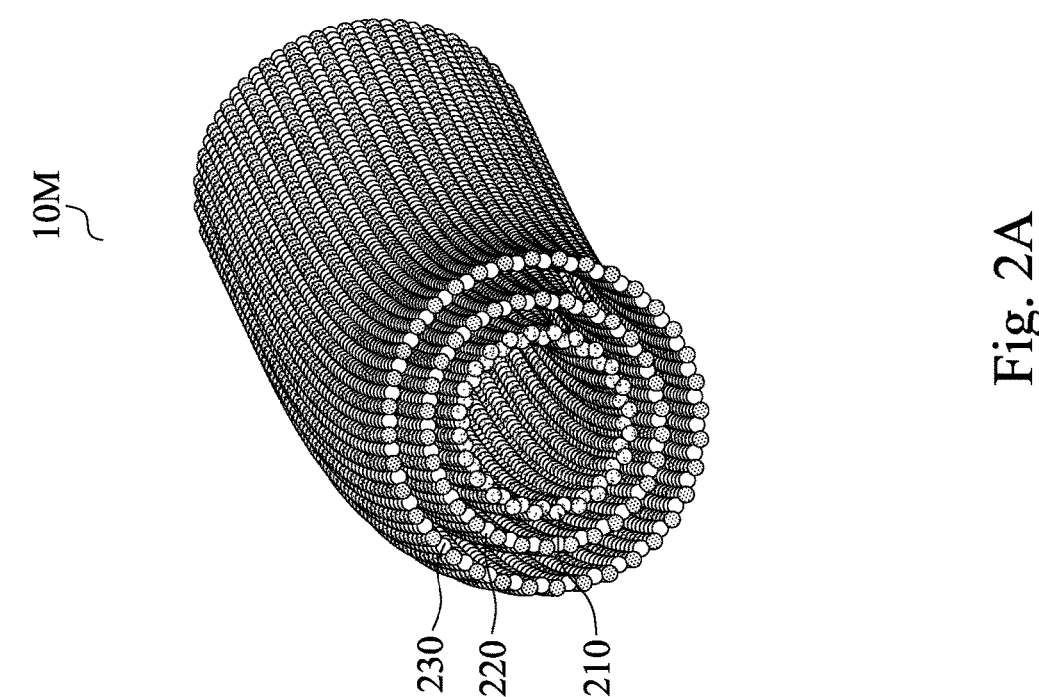
Fig. 2A

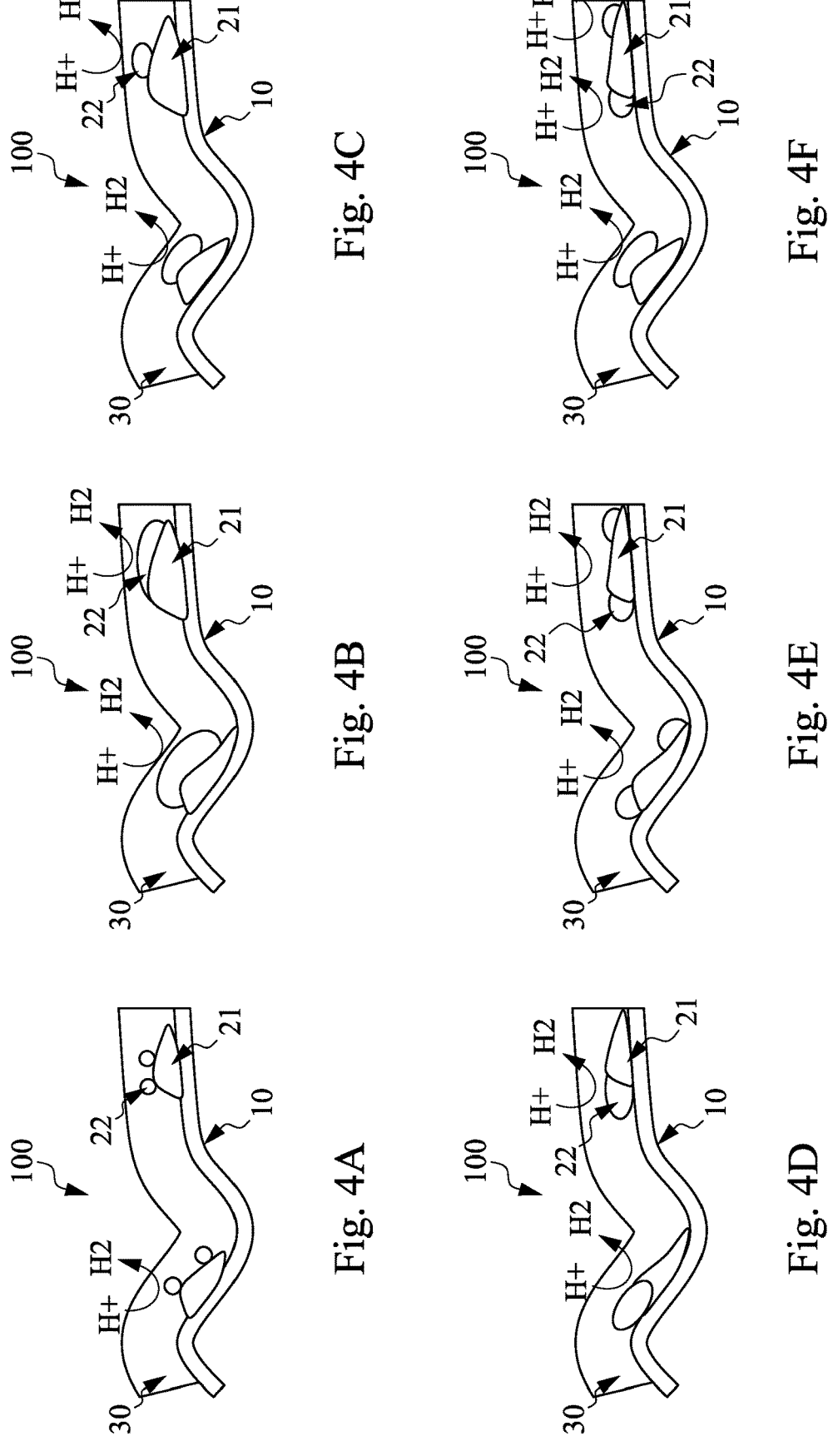

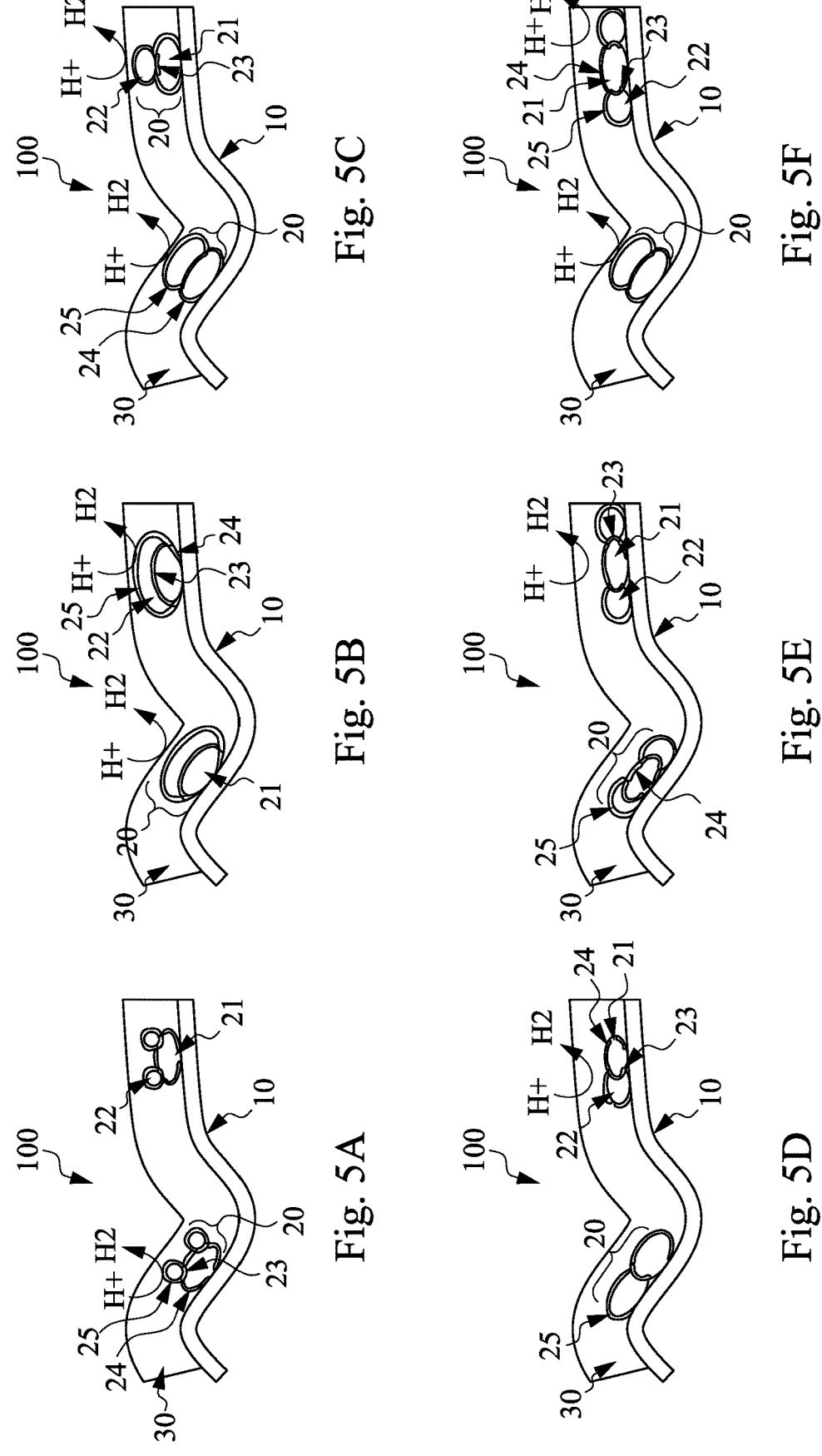

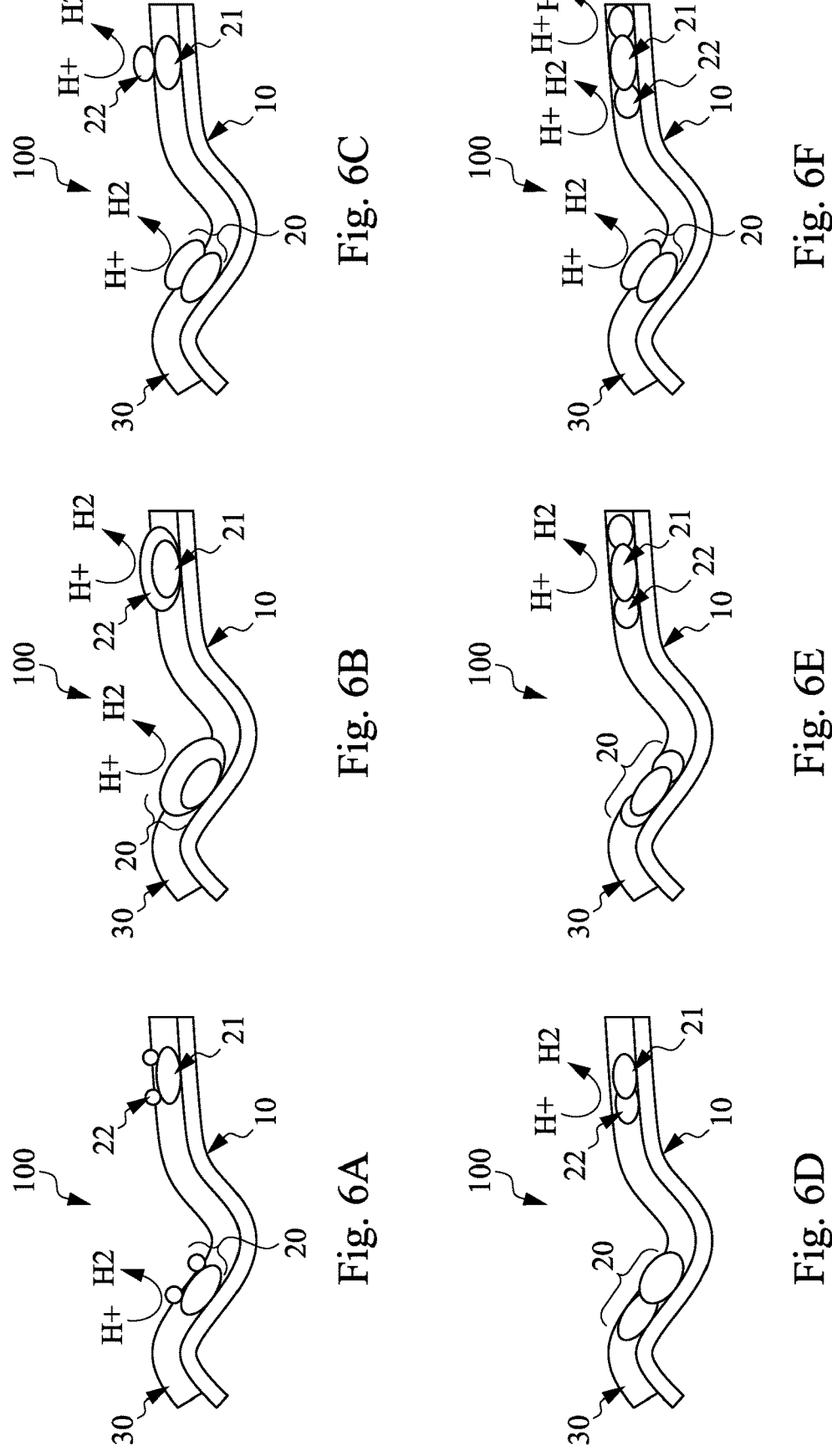

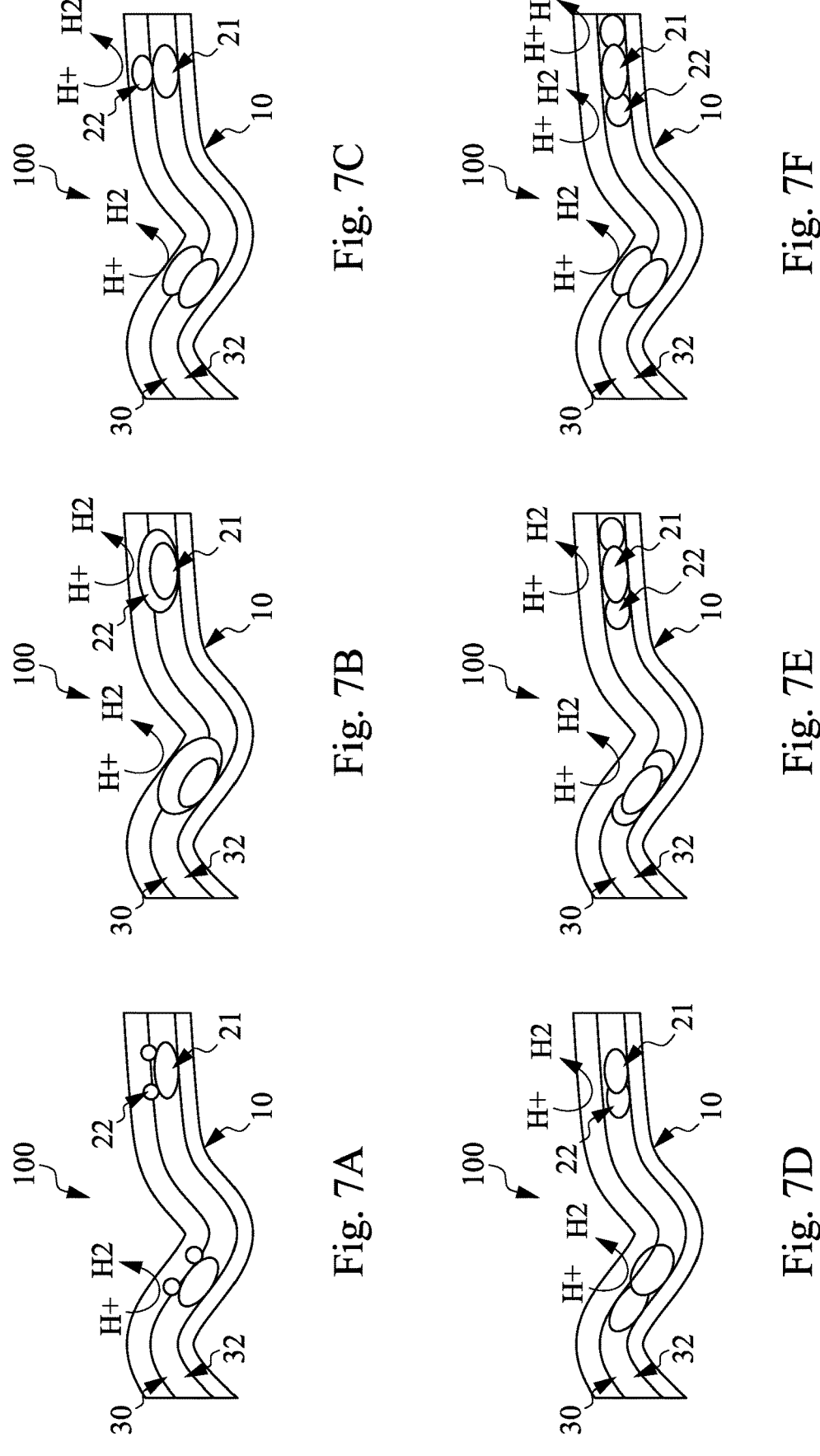

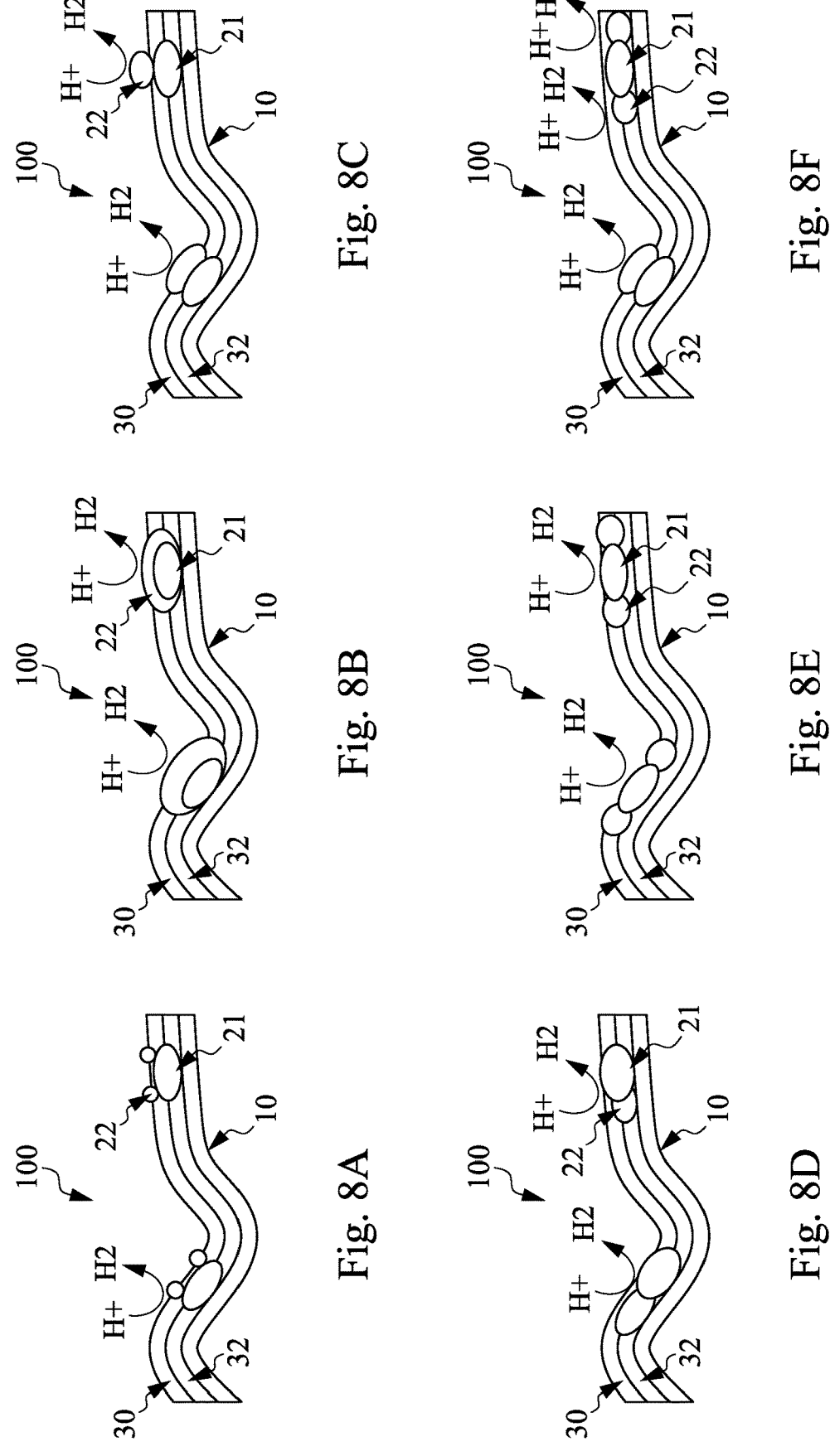

MoO3 deposition

Ru deposition

SiN deposition

Photo resist layer (PR)
Target layer (TL)
Substrate

Reflective mask

Pellicle

PR
TL
Substrate

EUV

PR        PR
TL        TL
Substrate

TL        TL
Substrate

1400

S1401 — Forming a target layer over a substrate

S1402 — Forming a photo resist layer over the target layer

S1403 — Exposing the photo resist layer to an EUV radiation, and patterning the photo resist layer S1404 — Patterning the target layer

1500

S1501 Forming a plurality of nanotubes to form a membrane

S1502 Forming functional groups

S1503 Forming a plurality of first nano-particles

S1504 Forming a plurality of second nano-particles

S1505 Forming a protection layer

S1506 Attaching the membrane to a frame

1600

S1601 Forming a plurality bundles of nanotubes to form a membrane

S1602 Forming the plurality of Ru-O-X structures

S1603 Forming a protection layer

S1604 Attaching the membrane to a frame

1700

S1701 Forming a plurality of nanotubes to form a membrane

S1702 Forming functional groups

S1703 Forming a plurality of first nano-particles

S1704 Forming a plurality of second nano-particles

S1705 Attaching the membrane to a frame

PELLICLE AND METHOD OF MANUFACTURING THEREOF

BACKGROUND

A pellicle is a thin transparent film stretched over a frame that is glued over one side of a photo mask to protect the photo mask from damage, dust and moisture. In extreme ultraviolet (EUV) lithography, a pellicle having high EUV light transmittance, high mechanical strength, high endurance against attacking particles, and prolonged lifetime is generally required.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2A, 2B, 2C and 2D show various views of multi-wall nanotubes in accordance with some embodiments of the present disclosure.

FIGS. 4A, 4B, 4C, 4D, 4E and 4F show structures of various membranes of a pellicle for an EUV photo mask in accordance with a second embodiment of the present disclosure.

FIGS. 5A, 5B, 5C, 5D, 5E and 5F show structures of various membranes of a pellicle for an EUV photo mask in accordance with a third embodiment of the present disclosure.

FIGS. 6A, 6B, 6C, 6D, 6E and 6F show structures of various membranes of a pellicle for an EUV photo mask in accordance with a fourth embodiment of the present disclosure.

FIGS. 7A, 7B, 7C. 7D, 7E and 7F show structures of various membranes of a pellicle for an EUV photo mask in accordance with a fifth embodiment of the present disclosure.

FIGS. 8A, 8B, 8C, 8D, 8E and 8F show structures of various membranes of a pellicle for an EUV photo mask in accordance with a sixth embodiment of the present disclosure.

DETAILED DESCRIPTION

Figure 1B:
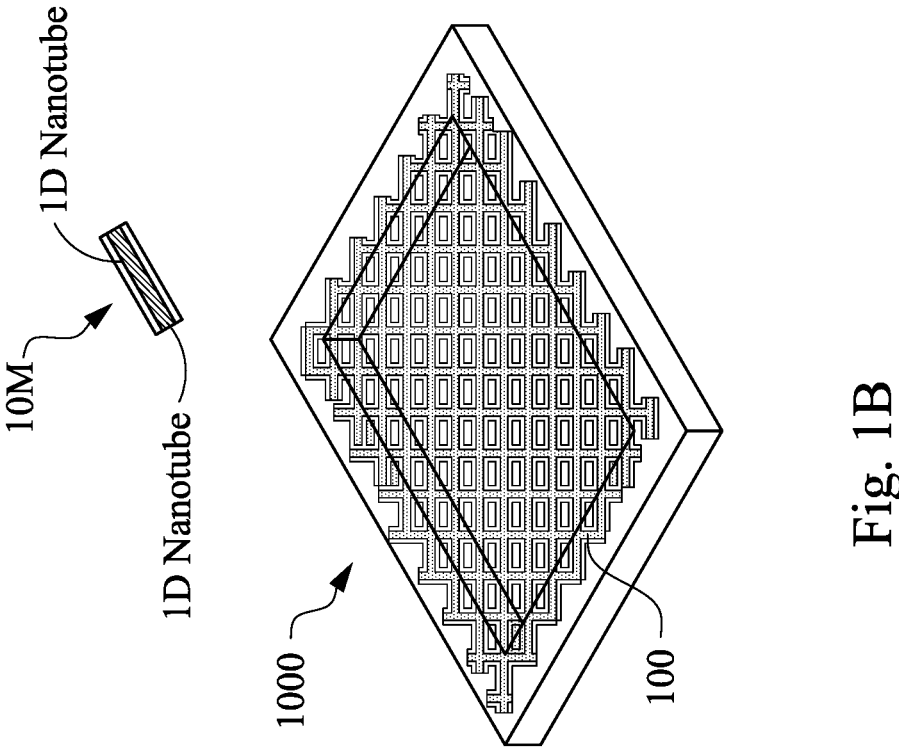
FIGS. 1A, 1B, and 1C show pellicles for an EUV photo mask in accordance with some embodiments of the present disclosure.

It is to be understood that the following disclosure provides many different embodiments, or examples, for implementing different features of the invention. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity. In the accompanying drawings, some layers/features may be omitted for simplification.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device may be otherwise oriented (rotated 90 degrees or at other orientations) and the spatially relative descriptors used herein may likewise be interpreted accordingly. In addition, the term "made of" may mean either "comprising" or "consisting of." Further, in the following fabrication process, there may be one or more additional operations in between the described operations, and the order of operations may be changed. In the present disclosure, the phrase "at least one of A, B and C" means either one of A, B, C. A+B, A+C, B+C or A+B+C, and does not mean one from A, one from B and one from C, unless otherwise explained. Materials, configurations, structures, operations and/or dimensions explained with one embodiment can be applied to other embodiments, and detained description thereof may be omitted.

EUV lithography is one of the crucial techniques for extending Moore's law. However, due to wavelength scaling from 193 nm (ArF) to 13.5 nm (even wavelength reduce to 6.7 nm), the EUV light source suffers from strong power decay due to environmental absorption. Even though a stepper/scanner chamber is operated under vacuum to prevent strong EUV absorption by gas, maintaining a high EUV transmittance from the EUV light source to a wafer is still an important factor in EUV lithography. An EUV scanner works in an environment with high hydrogen flow as well as minor nitrogen and oxygen gas flow, however a pellicle of carbon nanotubes (CNTs) is hard to withstand hydrogen/ oxygen attacks.

A pellicle is typically used to protect a photo mask from damage, dust and moisture. In UV or DUV lithography, the pellicle film is made of a transparent resin film. In EUV lithography, however, a resin based film would not be acceptable, and a non-organic material (such as a polysilicon, silicide or metal film) is used. Carbon nanotubes (CNTs) are one of the materials suitable for a pellicle for an EUV photo mask, because CNTs have a high EUV transmittance of more than 96.5%. Other nanotubes made of a non-carbon based material are also usable for a pellicle for an EUV photo mask. A nanotube can be a one dimensional (1D) elongated nanotube having a dimeter in a range from about 0.5 nm to about 100 nm for example.

A pellicle for an EUV photo mask requires high EUV transmittance, strong mechanical strength, and high endurance under high EUV energy exposure and hydrogen/oxygen atom attacks. In an EUV scanner, bare nanotubes of a pellicle can be easily etched or damaged by EUV-induced hydrogen and oxygen particles, for example. Amorphous films can be used to protect the CNTs of a pellicle, however, the amorphous films can easily be etched in the EUV scanner during operation.

In the present disclosure, a pellicle for an EUV photo mask includes a membrane attached to a frame. The membrane includes a plurality of nanotubes of a nanotube material, a plurality of Ru—O—X structures (X is a metal element Mo, Ti, Zr or Nb) partially covering a surface of each nanotube of the plurality of nanotubes, and a protection layer of a capping material to cover the Ru—O—X structures and the surface of each nanotube. The Ru—O—X structures include a plurality of first nano-particles of a X-containing material partially covering each nanotube, and a plurality of second nano-particles of a Ru-containing material formed on the plurality of first nano-particles, thereby forming catalysts or catalyst bridges that can reduce damage by attacking particles (such as hydrogen particles). The pellicle advantageously has good EUV light transmittance and improved endurance against attacking particles under EUV exposure environment, and thereby prolonged lifetime.

In some embodiments, the X-containing material is metal Mo or Mo compound, such as one selected from the group consisting of Mo, $MoO_2$, and $MoO_3$. In other embodiments, the X-containing material is metal Ti or a Ti compound, such as one selected from the group consisting of Ti, $TiO_2$, TiN, and TiON. In further other embodiments, the X-containing material is metal Zr or a Zr compound, such as one selected from the group consisting of Zr, $ZrO_2$, and $ZrO_3$. In some embodiments, the Ru-containing material is selected from the group consisting of Ru, $RuO_2$, $RuSi_2$, RuSi, and $Ru_2Si_3$. In some embodiments, the capping material is selected from the group consisting of SiN, SiON, AlN, $Y_2O_3$, $Al_2O_3$, YSiO, and SiC, or a combination thereof.

Figure 1A:
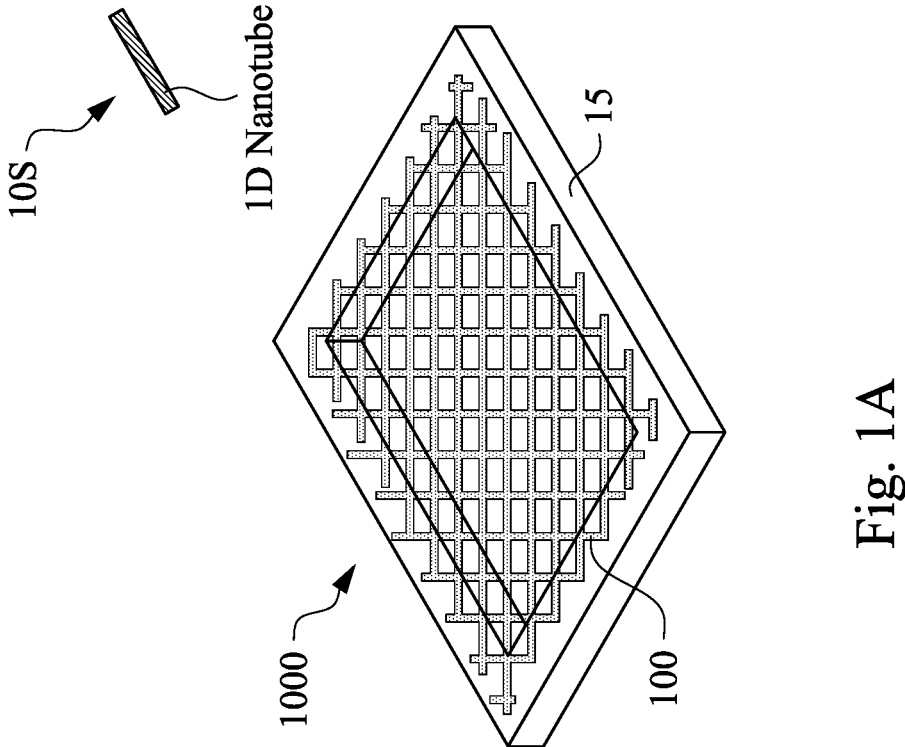

FIGS. 1A and 1B show EUV pellicles 1000 in accordance with an embodiment of the present disclosure. In some embodiments, a pellicle 1000 for an EUV photo mask includes a main network membrane 100 disposed over and attached to a pellicle frame 15. Terms "main network membrane", "pellicle membrane", and "membrane" are interchangeably used here. In some embodiments, a membrane is attached to a border (e.g., formed of Si, Qz, or other materials), and is attached to a frame (e.g., formed of Ti or other materials) with vent holes (not shown).

In some embodiments, the main network membrane 100 are formed by a plurality of single-wall or multiwall nanotubes 10 of a single material, and in other embodiments, the main network membrane 100 are formed by a plurality of single-wall or multiwall nanotubes 10 of multiple different materials. In some embodiments, a nanotube is a one dimensional (1D) elongated nanotube 10 having a dimeter in a range from about 0.5 nm to about 100 nm, and in other embodiments, the dimeter of the 1D elongated nanotube is in a range from about 10 nm to about (1000 um).

Figure 1C:
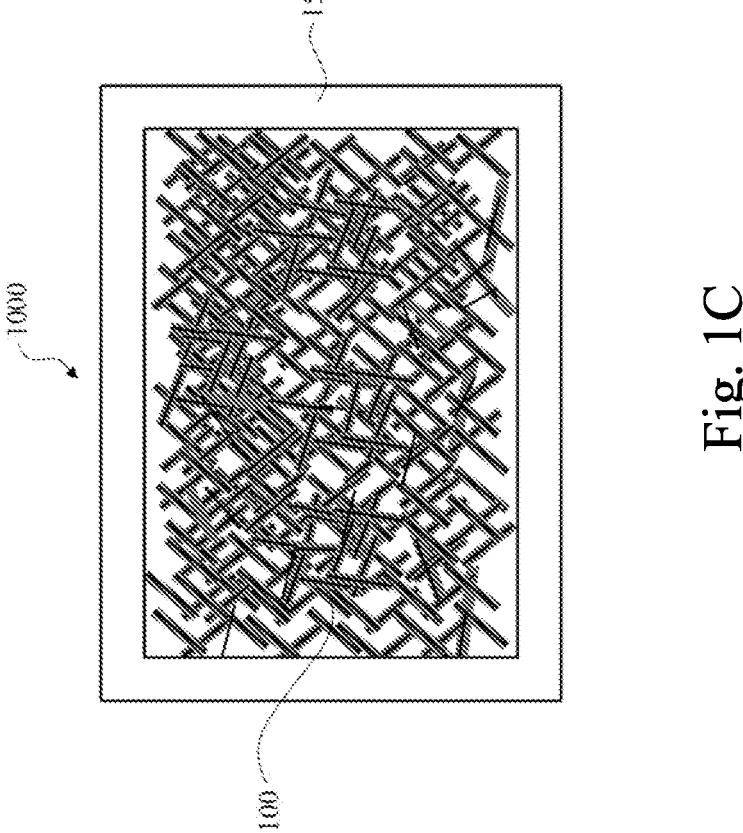

In some embodiments, as shown in FIG. 1A, the main network membrane 100 includes a plurality of single-wall nanotubes 10S. In some embodiments, as shown in FIG. 1A, the main network membrane 100 includes a plurality of multi-wall nanotubes 100S. In some embodiments, the single-wall nanotubes 10S are carbon nanotubes, and in other embodiments, the single-wall nanotubes 10S are nanotubes made of a non-carbon based material. In some embodiments, the multi-wall nanotubes are carbon nanotubes, and in other embodiments, the single-wall nanotubes are nanotubes made of a non-carbon based material. In some embodiments, the single-wall or multiwall nanotube bundles are dispersed in a specific orientation as shown in FIGS. 1A and 1B. In other embodiments, the single-wall or multiwall nanotube bundles are randomly dispersed as shown in FIG. 1C.

In other embodiments, as shown in FIG. 1B, the main network membrane 100 includes a plurality of multiwall nanotubes 10M. In some embodiments, a multiwall nanotube 10M is a co-axial nanotube having two or more tubes co-axially surrounding at least one inner tube. In some embodiments, the main network membrane 100 includes only one type of nanotubes 10 and in other embodiments, different types of nanotubes 10 form the main network membrane 100.

In some embodiments, a pellicle frame 15 is attached to the main network membrane 100 to maintain a space between the main network membrane 100 of the pellicle 1000 and a pattern of an EUV photo mask (not shown) when mounted on the EUV mask. In some embodiments, a MWCNT membrane including large bundles (each bundle including e.g., 16-100 nanotubes) is attached on a border (e.g., made of Si, Qz or other materials), and is attached to a frame (e.g., made of Ti or other materials) including vents therein and being attached to an EUV mask. The pellicle frame 15 of the pellicle 1000 is attached to the surface of the EUV photo mask with an appropriate bonding material. In some embodiments, the bonding material is an adhesive, such as an acrylic or silicon based glue or an A-B cross link type glue. The size of the frame structure is larger than the area of the black borders of the EUV photo mask so that the pellicle covers not only the pattern area of the photo mask but also the black borders.

FIGS. 2A, 2B, 2C and 2D show various views of multi-wall nanotubes 10M in accordance with some embodiments of the present disclosure. In some embodiments, the nanotubes in the main network membrane 100 as shown in FIG. 1B include multiwall nanotubes 10M, which are also referred to as co-axial nanotubes 10M. The main network membrane 100 is formed of single-wall carbon nanotubes in some embodiments, and the main network membrane 100 is formed of multiwall carbon nanotubes (each including e.g., 2-10 walls) in other embodiments.

FIG. 2A shows a perspective view of a multiwall co-axial nanotube 10M having threes tubes 210, 220 and 230, and FIG. 2B shows a cross sectional view thereof. In some embodiments, the inner tube (or innermost tube) 210 is a carbon nanotube, and two outer tubes 220 and 230 are non-carbon based nanotubes, such as boron nitride nanotubes. In some embodiments, all tubes are non-carbon based nanotubes.

The number of tubes of the multiwall nanotubes is not limited to three. In some embodiments, the multiwall nanotube 10M has two co-axial nanotubes as shown in FIG. 2C. In other embodiments, the multiwall nanotube 10M includes the innermost tube 210 and the first to N-th nanotubes including the outermost tube 200N, where N is a natural number from 1 to about 20, as shown in FIG. 2D. In some embodiments, N is up to 10 or up to 5. In some embodiments, at least one of the first to the N-th outer layers is a nanotube coaxially surrounding the innermost nanotube 210. In some embodiments, two of the innermost nanotubes 210 and the first to the N-th outer layers 220, 230, . . . 200N are made of different materials from each other. In some embodiments, N is at least two (i.e., three or more tubes), and two of the innermost nanotubes 210 and the first to the N-th outer tubes 220, 230, . . . 200N are made of the same materials. In other embodiments, three of the innermost nanotubes 210 and the first to the N-th outer tubes 220, 230, . . . 200N are made of different materials from each other.

In some embodiments, at least two of the tubes of the multiwall nanotube 10M are made of a different material from each other. In some embodiments, adjacent two layers (tubes) of the multiwall nanotube are made of a different material from each other. In some embodiments, an outermost nanotube of the multiwall nanotube 10M is a non-carbon based nanotube. In some embodiments, the outermost tube or outermost layer of the multiwall nanotubes 10M is made of at least one layer of BN.

In some embodiments, the multiwall nanotube 10M includes three co-axially layered tubes made of different materials from each other. In other embodiments, the multiwall nanotube 10M includes three co-axially layered tubes, in which the innermost tube (first tube) and the second tube surrounding the innermost tube are made of materials different from each other, and the third tube surrounding the second tube is made of the same material as or different material from the innermost tube or the second tube.

In some embodiments, a diameter of the innermost nanotube of the multiwall nanotube 10M is in a range from about 0.5 nm to about 20 nm and is in a range from about 1 nm to about 10 nm in other embodiments. In some embodiments, a diameter of the multiwall nanotubes 10M (i.e., diameter of the outermost tube) is in a range from about 3 nm to about 40 nm and is in a range from about 5 nm to about 20 nm in other embodiments. In some embodiments, a length of the multiwall nanotube 10M is in a range from about 0.5 μm to about 50 μm and is in a range from about 1.0 μm to about 20 μm in other embodiments.

FIGS. 3A, 3B, 3C, 3C, 3D, 3E and 3F show structures of various membranes 100 of a pellicle for an EUV photo mask in accordance with an embodiment of the present disclosure. As shown in FIGS. 1A and 1B, in some embodiments, a pellicle 1000 for an EUV photo mask includes a frame 15 and a membrane 100 attached to the frame 15. In some embodiments, the membrane 100 is formed of nanotubes 10 of a nanotube material. In some embodiments, the nanotubes 10 as shown in FIGS. 3A-3F are single-wall nanotubes 10S as shown in FIGS. 1A-1B, and in other embodiments, the nanotubes 10 as shown in FIGS. 3A-3F are multiwall nanotubes 10M as shown in FIGS. 1A-1B.

As shown in FIGS. 3A-3F, in some embodiments, the membrane 100 includes a plurality of Ru—O—X structures 20 partially covering a surface of each nanotube 10 of the plurality of nanotubes, and a protection layer 30 of a capping material covering the plurality of Ru—O—X structures 20 and the surface of each nanotube 10. In some embodiments, X includes one or more metal elements selected from Mo, Ti, Zr or Nb.

In some embodiments, the plurality of Ru—O—X catalyst structures 20 include a plurality of first nano-particles 21 of a X-containing material partially covering the surface of each nanotube 10, and a plurality of second nano-particles 22 of a Ru-containing material formed on the plurality of first nano-particles 21. The Ru—O—X catalyst structures 20, functioning as catalysts or catalyst bridges, reduce damage on the nanotubes caused by attacking particles (such as hydrogen particles) against the nanotubes 10 in an EUV scanner, efficiently protect the nanotubes 10 from the attacking particles, and thus prolong lifetime of the membrane 100. Although the plurality of Ru—O—X catalyst structures 20 are formed on an upper side of the nanotube 10 in FIGS. 3A-3F, the plurality of Ru—O—X catalyst structures 20 are deposited any portion of the nanotube 10 in some embodiments as shown in FIG. 18A.

In some embodiments, the X-containing material includes Mo, $MoO_2$, $MoO_3$, or a combination thereof. In some embodiments, the X-containing material includes Ti, $TiO_2$, TiN, TiON, or a combination thereof. In some embodiments, the X-containing material includes Zr, $ZrO_2$, $ZrO_3$, or a combination thereof. In some embodiments, the Ru-containing material includes Ru, $RuO_2$, $RuSi_2$, RuSi, $Ru_2Si_3$, or a combination thereof. In some embodiments, the Nb-containing material includes Nb, NbO, $NbO_2$, $Nb_2O_5$, or a combination thereof. In some embodiments, the capping material includes SiN, SiON, AlN, $Y_2O_3$, $Al_2O_3$, YSiO, SiC, or a combination thereof. Although the protection layer (capping material) 30 covers an upper side of the nanotube 10 in FIGS. 3A-3F, the protection layer 30 partially or fully wraps around the nanotube 10 in some embodiments as shown in FIG. 18A.

In some embodiments, the first nano-particles 21 and the second nano-particles 22 are in the same morphologies or forms. In some embodiments, as shown in FIGS. 3A-3F, the first nano-particles 21 and the second nano-particles 22 are all in the same form of nano-grains. In some embodiments, not shown in the figures, the first nano-particles 21 and the second nano-particles 22 are all in the same form of nano-islands, nano-triangles, nano-hexagons, or irregular nano-shapes.

Figures 3A, 3B, 3C, 3D, 3E, 3F:
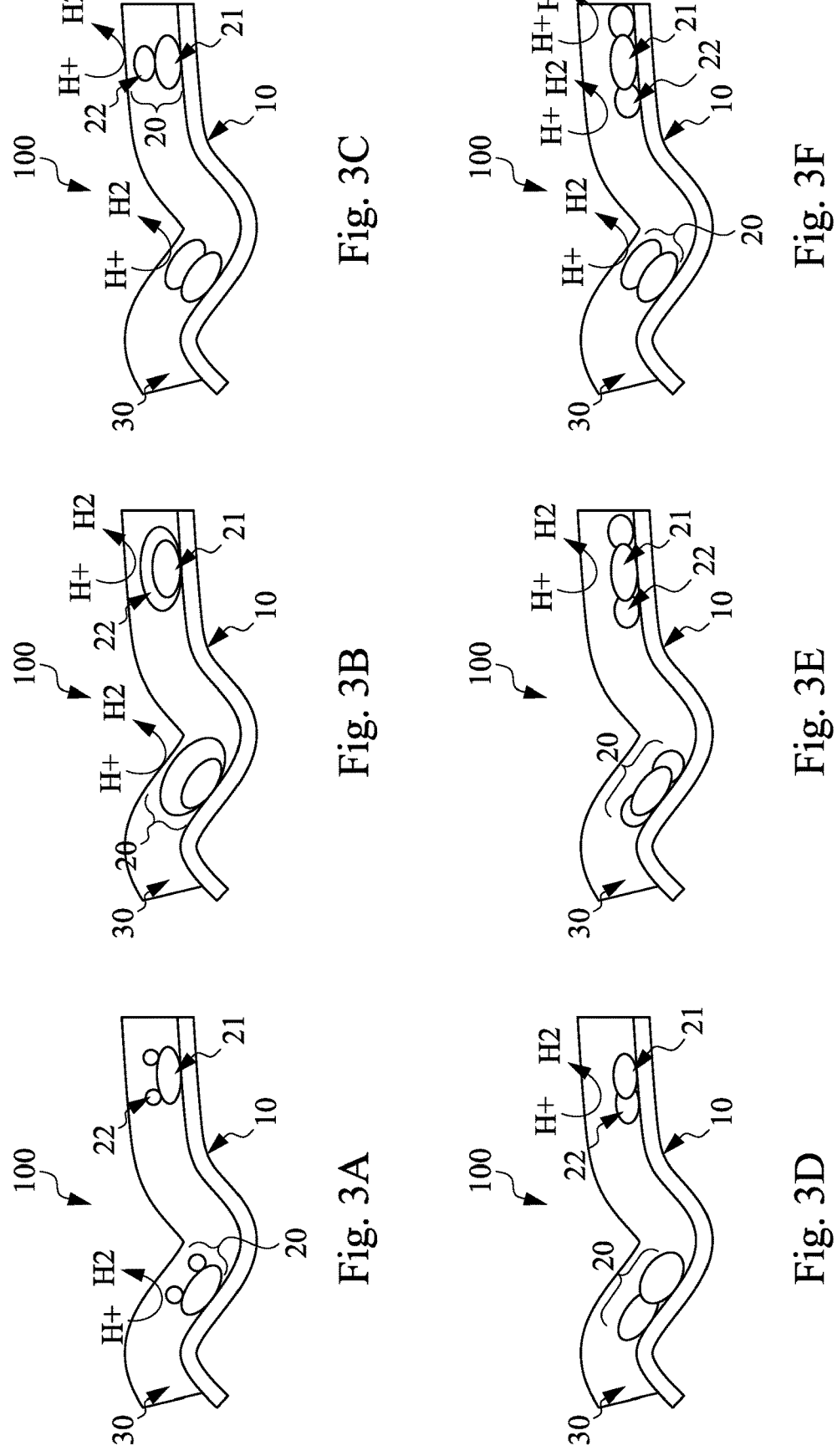
FIGS. 3A, 3B, 3C, 3D, 3E and 3F show structures of various membranes of a pellicle for an EUV photo mask in accordance with a first embodiment of the present disclosure.

There are various configurations or distributions of the first nano-particles 21 and the second nano-particles 22 with respect to the nanotubes 10 as shown in FIGS. 3A-3F. However, configurations or distributions of the first nano-particles 21 and the second nano-particles 22 with respect to the nanotubes 10 are not limited to the ways as shown in FIGS. 3A-3F. As shown in FIG. 3A, in some embodiments, the first nano-particles 21 are in contact with and partially cover the nanotubes 10, two or more second nano-particles 22 are dispersed on one of the first nano-particles 21, and the second nano-particles 22 are not in contact with the nanotubes 10. As shown in FIG. 3B, in some embodiments, the first nano-particles 21 are in contact with and partially cover the nanotubes 10, and some of the second nano-particles 22 partially wrap the first nano-particles 21 but not in contact with the nanotubes 10. As shown in FIG. 3C, in some embodiments, the first nano-particles 21 are in contact with and partially cover the nanotubes 10, a single second nano-particle 22 is formed on each first nano-particle 21, and the second nano-particles 22 are not in contact with the nanotubes 10. As shown in FIG. 3D, in some embodiments, the first nano-particles 21 are in contact with and partially cover the nanotubes 10, the second nano-particles 22 are in contact with and partially cover the nanotubes 10, and one of the first nano-particles 21 is in contact with one of the second nano-particles 22 side by side. As shown in FIG. 3E, in some embodiments, the first nano-particles 21 are in contact with and partially cover the nanotubes 10, some of the second nano-particles 22 are in contact with the nanotubes 10, and one of the first nano-particles 21 is in contact with two of the second nano-particles 22 side by side. FIG. 3F shows an embodiment that is a combination of embodiments as shown in FIGS. 3C and 3D. The same configurations or distributions of the first nano-particles 21 and the second nano-particles 22 on the nanotubes 10 with respect to the nanotubes 10 can be applied to any structures shown in the following FIGS. 4A-8F.

In some embodiments, the sizes of the first nano-particles 21 are in a range from about 0.2 nm to about 5 nm, and the second nano-particles 22 are in a range from about 0.2 nm to about 5 nm. In some embodiments, a size ratio of a first nano-particle 21 and a second nano-particle 22 is in a range from about 0.5 to about 1.5. In some embodiments, a total number of first particles 21 and second particles 22 for each nanotube 10 is in a range from about 5000 to about 100000. In some embodiments, for a nanotube 10, a ratio of a covered nanotube surface area by the nano-particles (such as the first nano-particles 21 and the second nano-particles 22) and an entire nanotube surface area is in a range from 0.5 to about 0.9. In other embodiments, the first nano-particles 21 are in contact with and entirely cover the surface of a nanotube 10, and the second nano-particles 22 are dispersed on the first nano-particles 21. The same sizes and configurations of the first nano-particles 21 and the second nano-particles 22 on the nanotubes 10 can be applied to any structure shown in the following FIGS. 4A-8F.

FIGS. 4A, 4B, 4C, 4C, 4D, 4E and 4F show structures of various membranes 100 of a pellicle for an EUV photo mask in accordance with an embodiment of the present disclosure. The structures of membranes 100 as shown in FIGS. 4A-4F are similar to those as shown in FIGS. 3A-3F except some aspects. In some embodiments, the first nano-particles 21 and the second nano-particles 22 are in different morphologies or forms. In some embodiments, as shown in FIGS. 4A-4F, the first nano-particles 21 are in the form of nano-islands, and the second nano-particles 22 are in the form of nano-grains. In some embodiments, not shown, the first nano-particles 21 are in the form of nano-grains, and the second nano-particles 22 are in the form of nano-islands.

FIGS. 5A, 5B, 5C, 5C, 5D, 5E and 5F show structures of various membranes 100 of a pellicle for an EUV photo mask in accordance with an embodiment of the present disclosure. The structures of membranes 100 as shown in FIGS. 5A-5F are similar to those as shown in FIGS. 3A-3F and/or 4A-4F except some aspects. As shown in FIGS. 5A-5F, in some embodiments, the membrane 100 includes first interdiffusions 23 at first interfaces between the first nano-particles 21 and the second nano-particles 22 that diffuse into each other by an annealing operation at a temperature in a range from about 500° C. to about 1000° C. In some embodiments, the membrane 100 also includes second interdiffusions 24 at second interfaces between the first nano-particles 21 and the protection layer 30 that diffuse into each other by the annealing operation. In some embodiments, the membrane 100 further includes third interdiffusions 25 at third interfaces between the second nano-particles 22 and the protection layer 30 that diffuse into each other by the annealing operation. The first interdiffusions 23, the second interdiffusions 24, and the third interdiffusions 25 can advantageously further protect the nanotubes 10 against attacking particles in the EUV scanner, thereby prolonging lifetime of the membrane 100 of the pellicle.

FIGS. 6A, 6B, 6C, 6C, 6D, 6E and 6F show structures of various membranes 100 of a pellicle for an EUV photo mask in accordance with an embodiment of the present disclosure. The structures of membranes 100 as shown in FIGS. 6A-6F are similar to those as shown in FIGS. 3A-3F, 4A-4F and/or 5A-5F except some aspects. As shown in FIGS. 6A-6F, in some embodiments, some of the plurality of Ru—O—X catalyst structures 20 protrude from the protection layer 30, more directly reduce attacking particles (such as hydrogen particles H+) against the membrane 100 in the EUV scanner, thereby prolonging lifetime of the membrane 100 of the pellicle. In other words, in FIGS. 3A-3F, 4A-4F and 5A-5F, all the plurality of Ru—O—X catalyst structures 20 are fully embedded in the protection layer 30, while in FIGS. 6A-6F, at least a part of the plurality of Ru—O—X catalyst structures 20 is exposed from the protection layer 30. In some embodiments, only the second nano-particles 22 are exposed from the protection layer 30, and in other embodiments, both the first and second nano-particles are exposed from the protection layer 30.

FIGS. 7A, 7B, 7C, 7C, 7D, 7E and 7F show structures of various membranes 100 of a pellicle for an EUV photo mask in accordance with an embodiment of the present disclosure. The structures of membranes 100 as shown in FIGS. 7A-7F are similar to those as shown in FIGS. 3A-3F, 4A-4F, 5A-5F and/or 6A-6F except some aspects. In some embodiments, as shown in FIGS. 7A-7F, the protection layer includes at least a first sub-protection layer 30 and a second sub-protection layer 32 made of different capping materials that are, respectively, selected from the group consisting of SiN, SiON, AlN, $Y_2O_3$, $Al_2O_3$, YSiO, and SiC, or a combination thereof. The same configuration of the protection layer as shown in FIGS. 7A-7F can be applied to any structure shown in FIGS. 3A-6F.

FIGS. 8A, 8B, 8C, 8C, 8D, 8E and 8F show structures of various membranes 100 of a pellicle for an EUV photo mask in accordance with an embodiment of the present disclosure. The structures of membranes 100 as shown in FIGS. 8A-8F are similar to those as shown in FIGS. 7A-7F except some aspects. As shown in FIGS. 8A-8F, in some embodiments, some of the plurality of Ru—O—X catalyst structures 20 protrude from the protection layer including at least a first protection layer 30 and a second protection layer 32, more directly reduce attacking particles (such as hydrogen particles H+) against the membrane 100 in the EUV scanner, thereby prolonging lifetime of the membrane 100 of the pellicle. In other words, as shown in FIGS. 8A-8F, at least a part of the plurality of Ru—O—X catalyst structures 20 is exposed from the second protection layer 32. In some embodiments, as shown in FIGS. 8A-8C and 8F, only some first nano-particles 21 are exposed from the second protection layer 32. In some embodiments, as shown in FIG. 8D, only some second nano-particles 22 are exposed from the second protection layer 32. In some embodiments, as shown in FIG. 8E, some of the first nano-particles 21 and the second nano-particles 22 are exposed from the second protection layer 32. The same configuration of the protection layer as shown in FIGS. 8A-8F can be applied to any structure shown in FIGS. 3A-6F.

Figure 9B:
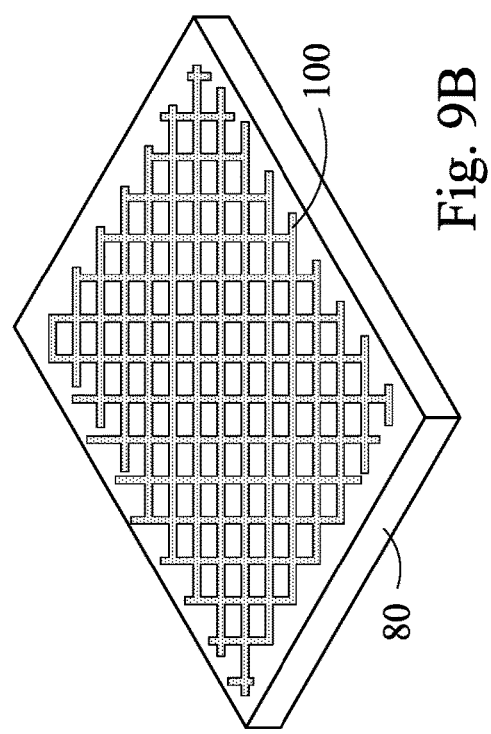
FIGS. 9A, 9B and 9C show manufacturing of nanotubes and a membrane of a pellicle for an EUV photo mask in accordance with some embodiments of the present disclosure.
Figure 9C:
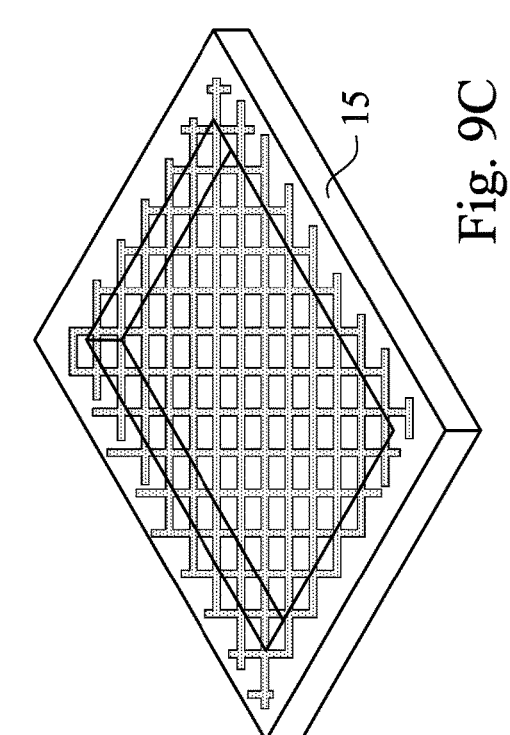
Figure 9A:
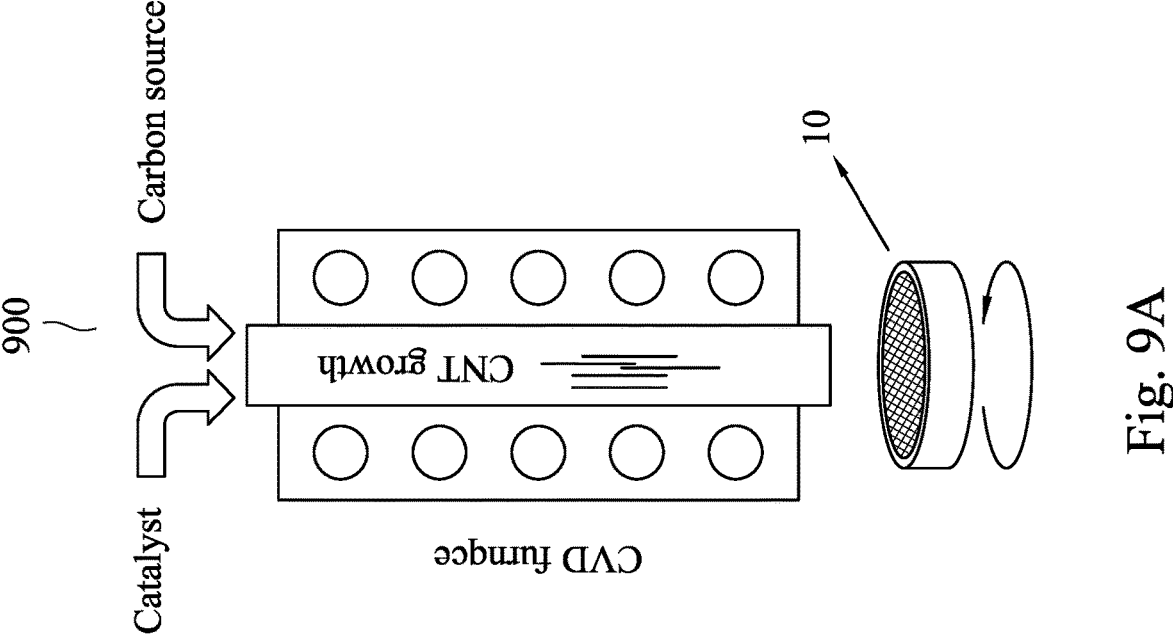

FIGS. 9A, 9B and 9C show manufacturing of nanotubes 10 and a membrane 100 in accordance with some embodiments of the present disclosure. Nanotubes 10 and the membrane 100 are not limited to be formed only in this way, and can be formed in other ways.

In some embodiments, nanotubes 10 are formed by a chemical vapor deposition (CVD) process. In some embodiments, the CVD process is performed by using a vertical furnace 900 as shown in FIG. 9A, and synthesized nanotubes 10 are deposited on a support membrane 80 as shown in FIG. 9B. In some embodiments, carbon-based nanotubes 10 are formed from a carbon source gas (precursor) using an appropriate catalyst, which is selected from the group consisting of Fe, CoFe, Co, CoNi, Ni, CoMo, and FeMo. In other embodiments, non-carbon based nanotubes 10 are formed from a non-carbon source gas, which is a precursor containing B. S, Se, Mo and/or W, and using an appropriate catalyst, which is selected from the group consisting of Fe, CoFe, Co, CoNi, Ni, CoMo, and FeMo. Then, the membrane 100 is formed over a support membrane 80, detached from the support membrane 80, and transferred onto the pellicle frame 15 as shown in FIG. 9C. In some embodiments, a stage or a susceptor, on which the support membrane 80 is disposed, rotates continuously or intermittently (step-by-step manner) so that the synthesized nanotubes are deposited on the support membrane 80 with different or random directions.

In some embodiments, carbon nanotubes are dispersed in a solution, not shown. The solution includes a solvent, such as water or an organic solvent, and a surfactant, such as sodium dodecyl sulfate (SDS). The nanotubes are one type or two or more types of nanotubes (material and/or wall numbers). In some embodiments, carbon nanotubes are formed by various methods, such as arc-discharge, laser ablation or chemical vapor deposition (CVD) methods.

In some embodiments, a support membrane is placed between a chamber or a cylinder in which the nanotube dispersed solution is disposed and a vacuum chamber (not shown). In some embodiments, the support membrane is an organic or inorganic porous or mesh material. In some embodiments, the support membrane is a woven or non-woven fabric. In some embodiments, the support membrane has a circular shape in which a pellicle size of a 150 mm×150 mm square (the size of an EUV mask) can be placed.

In some embodiments, the pressure in the vacuum chamber is reduced so that a pressure is applied to the solvent in the chamber or cylinder. Since the mesh or pore size of the support membrane is sufficiently smaller than the size of the nanotubes, the nanotubes are captured by the support membrane while the solvent passes through the support membrane. The support membrane on which the nanotubes are deposited is detached from the filtration apparatus and then is dried, and thus a nanotube membrane is formed.

Figure 10A:
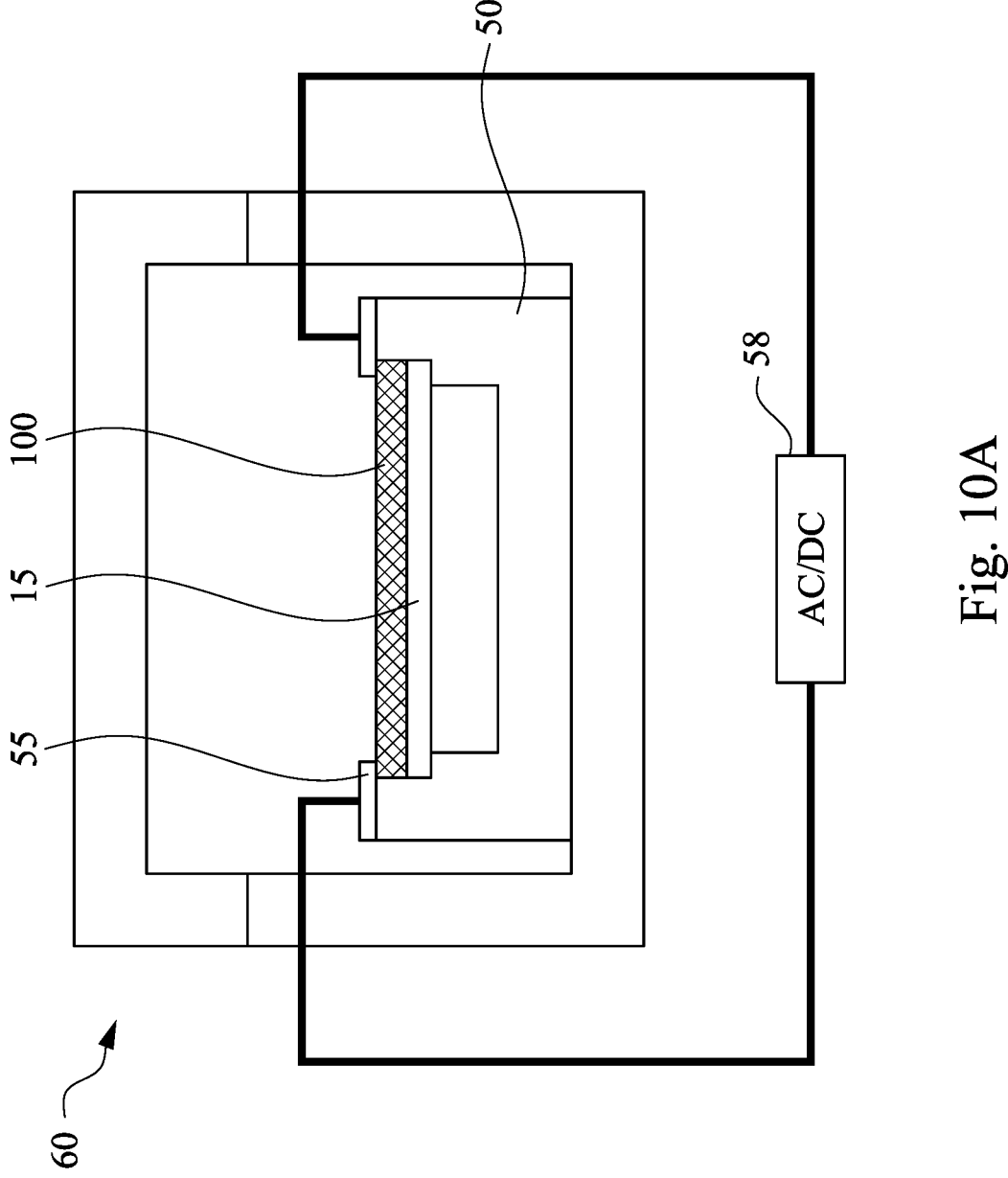
FIGS. 10A and 10B show forming nanotube bundles from nanotubes according to an embodiment of the present disclosure.
Figure 10B:
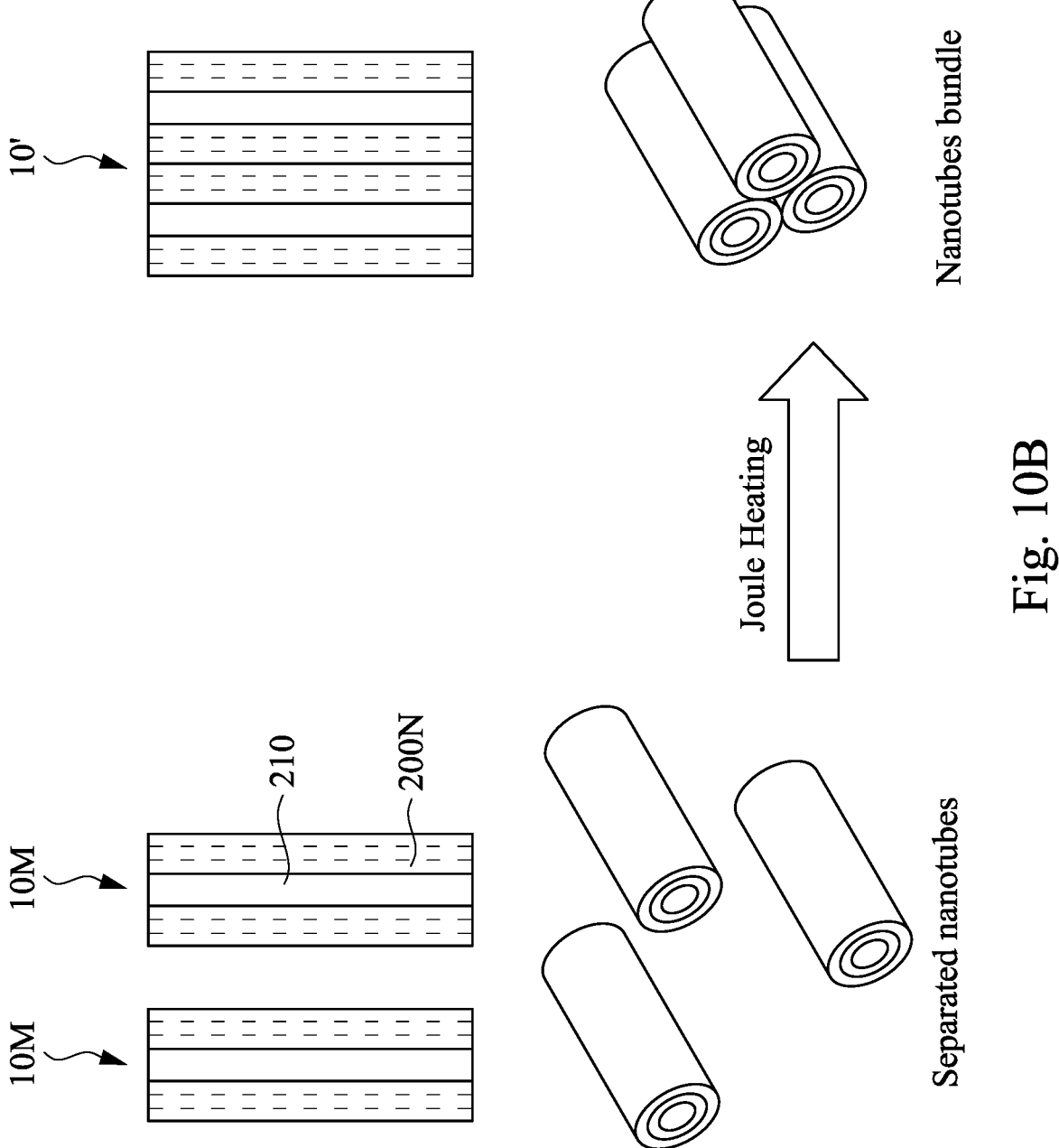

FIGS. 10A and 10B show forming nanotube bundles 10' according to an embodiment of the present disclosure. Nanotube bundles 10' of a membrane 100 are not limited to be formed only in the ways as shown in FIGS. 10A and 10B, and can be formed in other ways.

As shown in FIG. 10A, a membrane 100 and a frame 15 of a pellicle 1000 (as shown in FIGS. 1A and 1B) are placed over an insulating support 50 and are clamped at the edge portions of the pellicle by parts of the insulating support 50 and electrodes 55. In some embodiments, the insulating support 50 is made of ceramic, and the electrodes 55 are made of metal (such as tungsten, copper or steel). The electrodes 55 are attached to contact the membrane 100. In some embodiments, the electrodes 55 are attached to two side portions (e.g., left and right) of the membrane 100. In some embodiments, the length of the electrodes is greater than the length of the sides of the membrane 100 and the frame 15. In some embodiments, the membrane 100 and the frame 15 are horizontally supported. In some embodiments, the electrodes 55 are connected to a current source (power supply) 58 by wires.

A Joule heating apparatus, on which a membrane 100 formed of one or more nanotube materials is mounted, is placed in a vacuum chamber 60. In some embodiments, the vacuum chamber 60 includes a bottom part where the Joule heating apparatus is placed and an upper (lid) part, and a gasket (e.g., O-ring) is disposed between the bottom part and the upper part. The wires of the Joule heating apparatus are connected to outside wires, which are connected to the power supply 58.

In a Joule heating operation, the vacuum chamber 60 is evacuated to a pressure equal to or lower than 10 Pa in some embodiments. In some embodiments, the pressure is more than 0.1 Pa. The power supply 58 applies current to the membrane 100 so that the current passes through the membrane and generates heat. In some embodiments, the current is DC, and in other embodiments, the current is AC or pulse current.

In some embodiments, the current from the power supply 58 is adjusted such that the membrane 100 is heated at a temperature in a range from about 800° C. to 2000° C. In some embodiments, the lower limit of the temperature is about 1000° C., 1200° C. or 1500° C., and the upper limit is about 1500° C., 1600° C. or 1800° C. In some embodiments, the temperature can be adjusted so that metal particles (e.g., iron as residual catalyst) is vaporized under the vacuum and evacuated. In this way, the catalyst, for example, selected from the group consisting of Fe, CoFe, Co, CoNi, Ni, CoMo, and FeMo and used during forming the membrane 100 of the nanotubes 10, is greatly reduced from the membrane 100 due to the high temperature adopted during the process of forming bundles 10' of nanotubes, thereby advantageously improving transmittance of the membrane 100.

When the temperature is lower than these ranges, the contaminant may not be fully removed, and when the temperature is higher than these ranges, the membrane and/or frame may be damaged. In some embodiments, the pellicle frame 15 is made of ceramic or a metal or metallic material having a higher electric resistance than the carbon nanotube membrane 100.

In some embodiments, the Joule heating operation is performed in an inert gas ambient, such as N₂ and/or Ar. In some embodiments, the Joule heating operation is performed for about 5 seconds to about 60 minutes, and is performed to about 30 seconds to about 15 minutes in other embodiments. When the heating time is shorter than these ranges, the contaminant may not be fully removed, and when the heating time is longer than these ranges, a cycle time or a process efficiency may be degraded.

As shown in FIG. 10B, in some embodiments, the Joule heating operation causes single separated nanotubes 10 (such as multiwall nanotubes 10M) to bond or join together, thereby forming a bundle 10' of nanotubes having a seamless graphitic structure, in which the nanotubes are firmly bonded or joined more than merely contacting each other. Two or more nanotubes 10M can be bonded or joined together to form a nanotube bundle 10'. In some embodiments, 2-15 nanotubes are bonded to form a medium bundle 10'. In some embodiments, 16-100 nanotubes are bonded to form a large bundle 10'. In some embodiments, more than 100 nanotubes are bonded to form a very large bundle 10'. In some embodiments, the carbon nanotube (CNT) membrane 100 as formed before the Joule heating treatment includes no or a small number of bundles 10' of nanotubes, and after the Joule heating treatment, the number of the bundles 10' of carbon nanotubes increases.

Figures 11A, 11B:
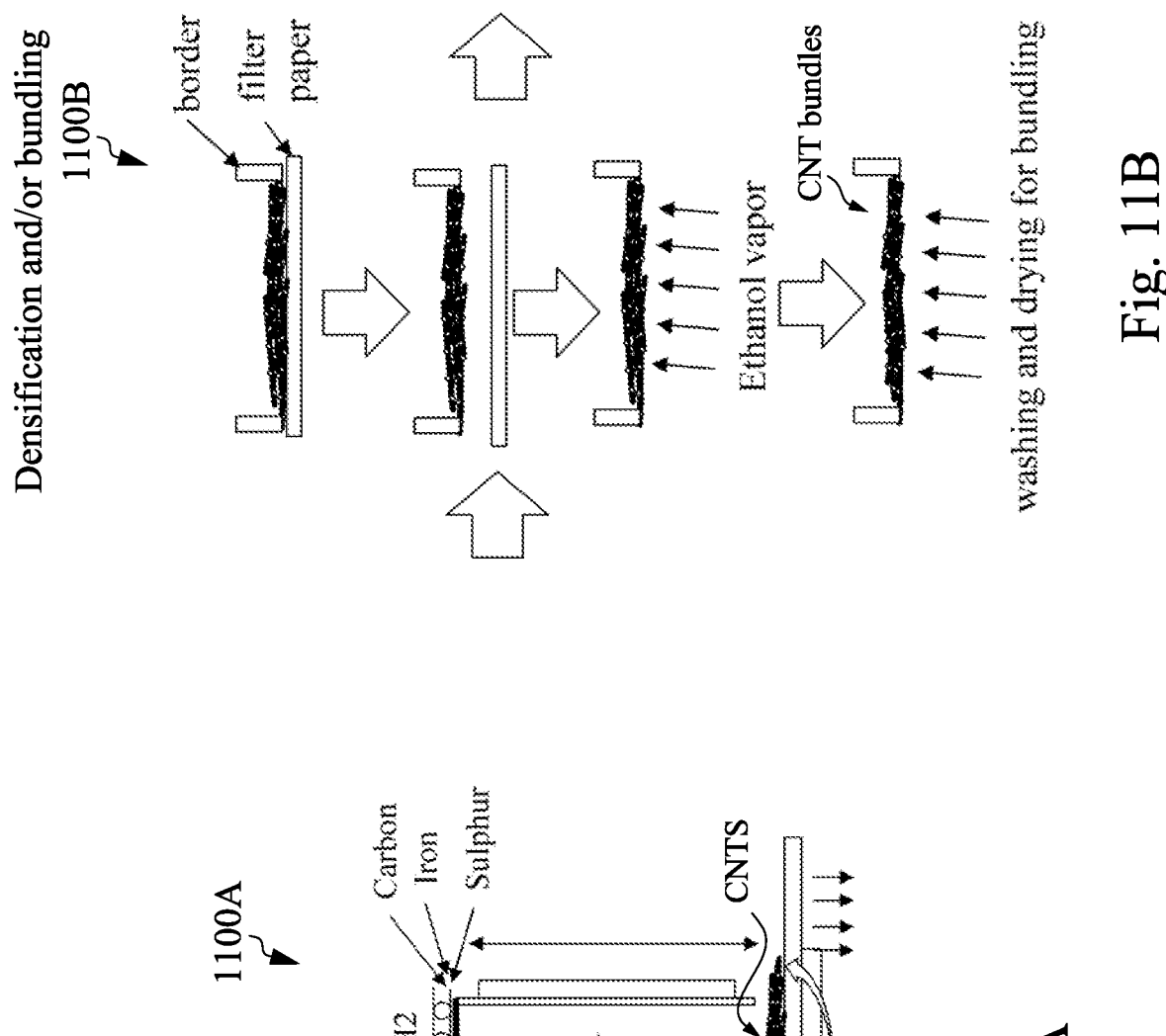
FIGS. 11A and 11B respectively show some operations of forming nanotubes and nanotube bundles in accordance with other embodiments of present disclosure.

FIG. 11A shows a CVD operation of forming or growing CNTs according to an embodiment of the present disclosure. In some embodiments, CNTs are formed or grown in a CNT fabrication reactor 1100A using carbon or corban-containing material as precursor at a working temperature in a range from about 500° C. to about 1100° C., and thus a membrane is formed. In some embodiments, Fe or Fe containing material is used as a catalyst for the growth of CNTs. In some embodiments, the formed CNTs are filtered with a support membrane (such as a filter paper). In some embodiments, the formed CNTs are sucked by applying a pressure control for uniform CNT dispersion.

FIG. 11B shows an operation of forming CNT bundles according to an embodiment of the present disclosure. In some embodiments, CNTs along with the filter paper are transferred to another place or chamber 1100B and are bordered by a border (support frame). After that, the filter paper is detached from the CNTs, and the CNTs are processed with solvent vapor (such as ethanol vapor). Then, CNTs are washed with a higher boiling point solvent (such as isoamyl acetate) and are dried for densification and bundling, thereby forming CNT bundles.

FIGS. 12A, 12B, 12C, 12D, 12E and 12F show sequential operations of manufacturing a membrane 100 of a pellicle for an EUV photo mask in accordance with an embodiment of the present disclosure.

Figures 12A, 12B, 12C, 12D, 12E, 12F:
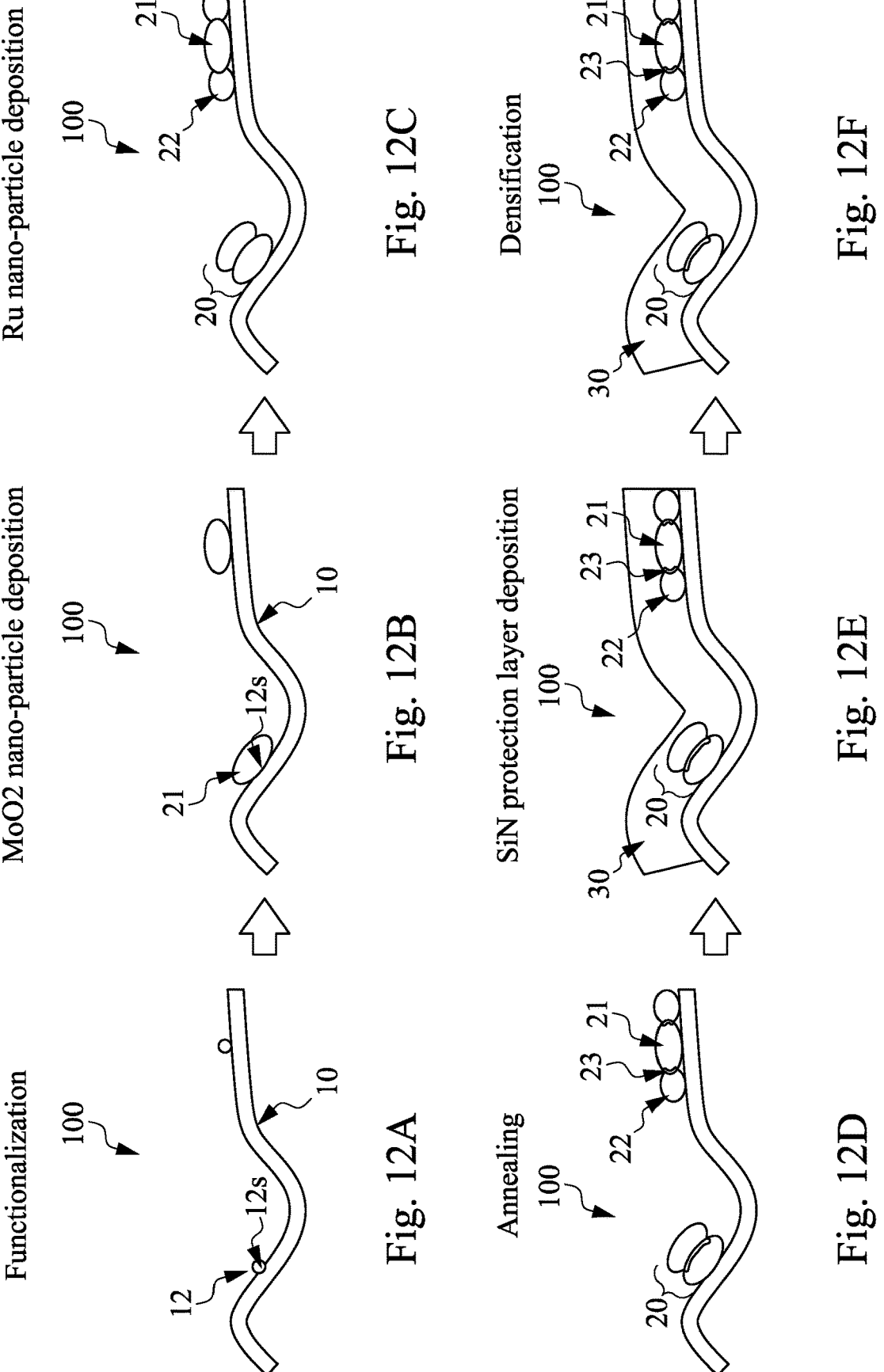
FIGS. 12A, 12B, 12C. 12D, 12E and 12F show sequential operations of manufacturing a membrane of a pellicle for an EUV photo mask in accordance with an embodiment of present disclosure.

As shown in FIG. 12A, in some embodiments, in a functionalization operation, functional groups 12 are formed to partially cover a surface of each nanotube 10 of the plurality of nanotubes, thereby creating nucleation sites 12s on the surface of each nanotube 10. In some embodiments, functional groups 12 include OH functional groups (or hydroxyl groups), and in other embodiments, functional groups 12 include NH functional groups. In some embodiments, OH functional groups are deposited by a CVD operation on nanotubes 10 using $H_2O_2$ as a precursor at a temperature in a range from 150° C. to about 300° C. In other embodiments, OH functional groups are CVD deposited by a CVD operation on nanotubes 10 using $H_2O$ as a precursor by a plasma with a power in a range from 50 W to about 300 W.

In some embodiments, the functional groups 12 are dispersed on and partially cover the surface of each nanotube 10 to create nucleation sites 12s on the surface of each nanotube 10 for nucleation or growth of the to-be-formed nano-particles.

As shown in FIG. 12B, in some embodiments, in an ALD deposition of first nano-particles, a plurality of first nano-particles 21 of a X-containing material (such as $MoO_2$) are deposited at the nucleation sites 12s that are created by the functional groups 12 on the surface of each nanotube 10.

As shown in FIG. 12C, in some embodiments, in an ALD deposition of second nano-particles, a plurality of second nano-particles 22 of a Ru-containing material are deposited on the plurality of first nano-particles 21 to form a plurality of Ru—O—X catalyst structures 20, functioning as catalysts or catalyst bridges, to partially cover each nanotube 10 of the plurality of nanotubes.

As shown in FIG. 12D, in some embodiments, in an annealing operation, after the Ru—O—X catalyst structures 20 are formed on the nanotubes 10 of the membrane 100, the membrane 100 is annealed in an ambient at a temperature from about 500° C. to about 1000° C., thereby forming interdiffusions 23 at interfaces between the first nano-particles 21 and the second nano-particles 22 that inter-diffuse each other. The interdiffusions 23 advantageously enhance protection of the nanotubes 10 of the membrane 100 against hydrogen particle attacks in the EUV scanner.

As shown in FIG. 12E, in some embodiments, in an ALD deposition of a protection layer, a protection layer 30 of a capping material are formed to cover the plurality of Ru—O—X catalyst structures 20 and the surface of each nanotube 10, thereby protecting the plurality of Ru—O—X structures 20 and the surface of each nanotube 10. In some embodiments, the capping material is SiN, SiON, AlN, $Y_2O_3$, $Al_2O_3$, YSiO, or SiC, or a combination thereof.

As shown in FIG. 12F, in some embodiments, in a densification process, after the protection layer 30 is formed on the plurality of Ru—O—X catalyst structures 20 and the surface of each nanotube 10, the protection layer 30 is densified by applying Ar plasma thereto. A densified protection layer 30 more efficiently protects the plurality of Ru—O—X catalyst structures 20 and the surface of each nanotube 10 under the protection layer 30. In some embodiments, a second annealing operation is performed to form the second interdiffusions 24 and the third interdiffusions 25 (as shown in FIGS. 5A-5F) in an ambient at a temperature from about 500° C. to about 1000° C. In some embodiments, the first annealing operation explained with respect to FIG. 12D is not performed, and the first, second, and third interdiffusions are formed by the second annealing operation after the protection layer is formed.

Figures 13A, 13B, 13C:
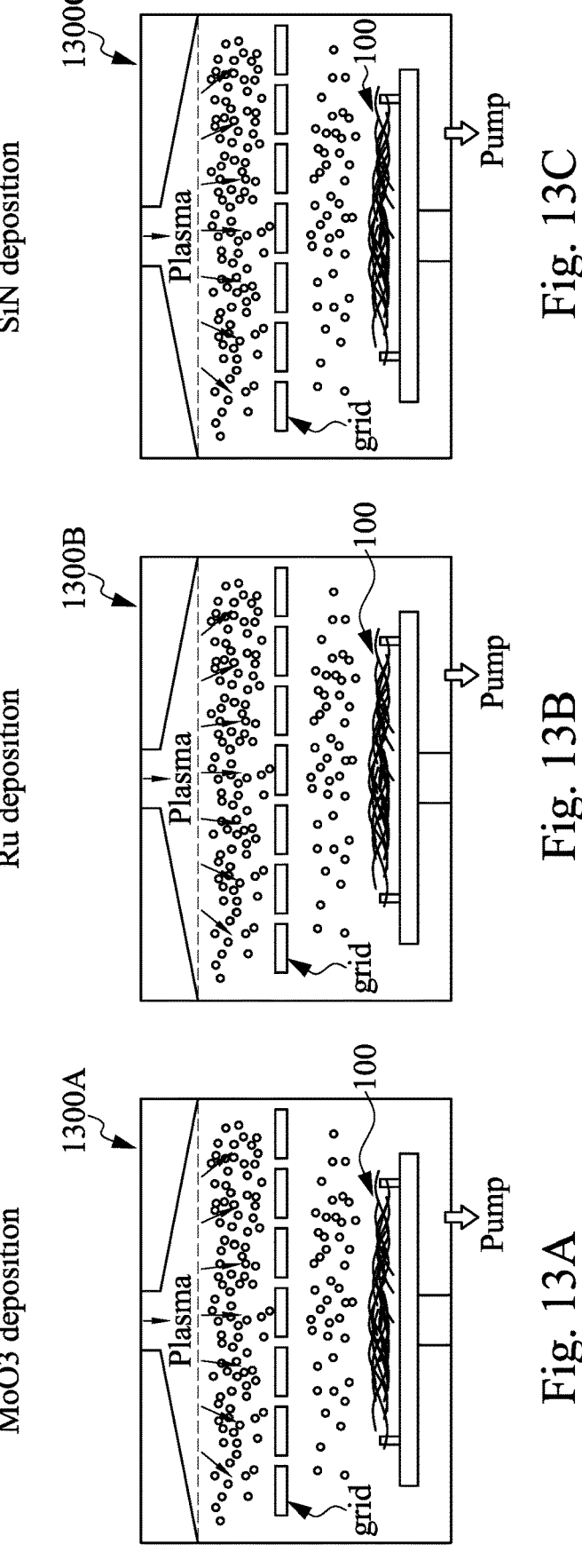
FIGS. 13A, 13B and 13C show some sequential operations of manufacturing a membrane of a pellicle for an EUV photo mask in accordance with some embodiments of present disclosure.

FIGS. 13A, 13B and 13C show sequential operations of manufacturing a membrane 100 of a pellicle for an EUV photo mask in accordance with some embodiments of present disclosure.

FIG. 13A shows an atomic layer deposition (ALD) of nanotube particles of an X-containing material in an ALD chamber 1300C according to an embodiment of the present disclosure. In some embodiments, in the ALD operation of depositing nanotube particles of the X-containing material on CNT bundles, a membrane 100 including CNT bundles is sent to the ALD chamber 1300C, $Mo(CO)_6$ (Ar gas carrier) is used as a first precursor, $H_2O$ (plasma at about 50~300 W) is used as a second precursor, and the operation is performed at a temperature in a range from about 170° C. to about 180° C. and at a pressure in a range from about 0.9 torr to about 1.1 torr, thereby depositing $MoO_3$ particles on the CNT bundles of the membrane 100.

FIG. 13B shows an ALD deposition of Ru nanotube particles in another ALD chamber 1300D (or in the same ALD chamber 1300C) according to an embodiment of the present disclosure. In some embodiments, in the ALD deposition of Ru nanotube particles on the $MoO_3$ particles, the membrane 100 including CNT bundles with $MoO_3$ particles deposited thereon is sent to the ALD chamber 1300D, bis(cyclopentadienyl) ruthenium $RuCp_2$ (Ar gas carrier, 60° C.) is used as a first precursor, $O_2$ (plasma at about 50~300 W) is used as a second precursor, and the operation is performed at a temperature in a range from about 340° C. to about 360° C. and at a pressure in a range from about 2.0 torr to about 2.4 torr, thereby depositing Ru nanotube particles on the $MoO_3$ particles. In this way, Ru—O—Mo catalyst structures, as catalysts or catalyst bridges, are formed on and partially cover the CNT bundles of the membrane 100.

FIG. 13C shows an operation of protection layer deposition in a still another ALD chamber 1300E according to an embodiment of the present disclosure. In some embodiments, in the ALD deposition operation of SiN, the membrane 100 including Ru—O—Mo structures deposited on CNT bundles is sent to the ALD chamber 1300E, trimethylsilane or $(CH_3)_3SiH$ (TMS) is used as a first precursor, $NH_3$ (plasma at about 50~300 W) is used as a second precursor, and the operation is performed at a temperature in a range from about 340° C. to about 360° C. and at a pressure in a range from about 2.0 torr to about 2.4 torr, thereby depositing a protection SiN layer on the Ru—O—Mo structures and the CNT bundles of the membrane 100. In FIGS. 13A-13C, a Mo containing material is used for the X material, but other metal containing materials can be used in the manufacturing method shown by FIGS. 13A-13C.

Figures 14A, 14B, 14C, 14D, 14E:
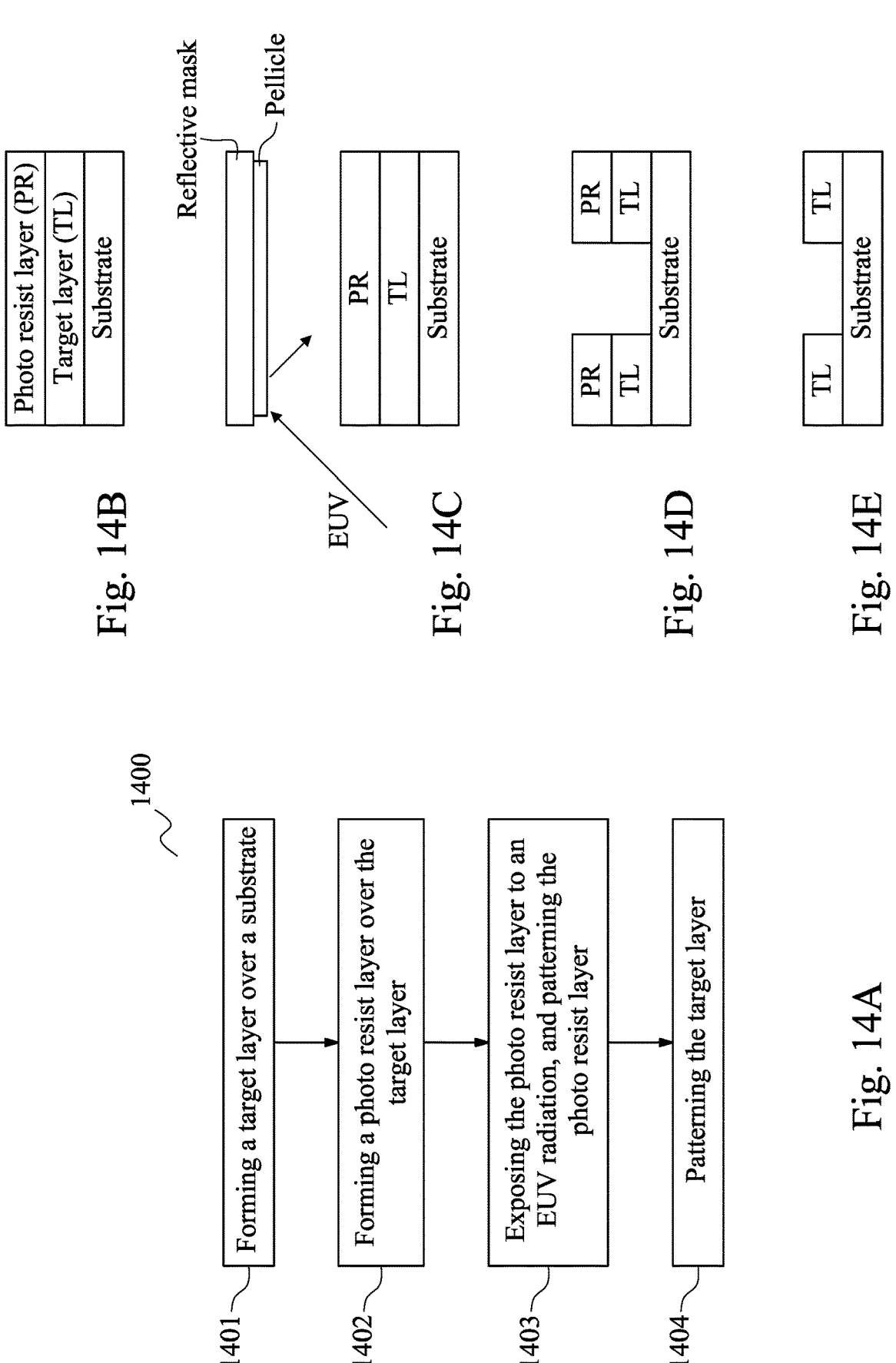
FIG. 14A shows a flowchart of a method of making a semiconductor device.
FIGS. 14B, 14C, 14D and 14E show sequential operations of a method of making a semiconductor device in accordance with some embodiments of present disclosure.

FIG. 14A shows a flowchart of a method 1400 of making a semiconductor device, and FIGS. 14B, 14C, 14D and 14E show sequential operations of a method of making a semiconductor device in accordance with embodiments of present disclosure. A semiconductor substrate or other suitable substrate to be patterned to form an integrated circuit thereon is provided. In some embodiments, the semiconductor substrate includes silicon. Alternatively, the semiconductor substrate includes germanium, silicon germanium or other suitable semiconductor material, such as a Group III-V semiconductor material.

At S1401 of FIG. 14A, a target layer to be patterned is formed over the semiconductor substrate. In certain embodiments, the target layer is the semiconductor substrate. In some embodiments, the target layer includes a conductive layer, such as a metallic layer or a polysilicon layer; a dielectric layer, such as silicon oxide, silicon nitride, SiON, SiOC, SiOCN, SiCN, hafnium oxide, or aluminum oxide; or a semiconductor layer, such as an epitaxially formed semiconductor layer. In some embodiments, the target layer is formed over an underlying structure, such as isolation structures, transistors or wirings.

At S1402 of FIG. 14A, a photo resist layer is formed over the target layer, as shown in FIG. 14B. The photo resist layer is sensitive to the radiation from the exposing source during a subsequent photolithography exposing process. In the present embodiment, the photo resist layer is sensitive to EUV light used in the photolithography exposing process. The photo resist layer may be formed over the target layer by spin-on coating or other suitable technique. The coated photo resist layer may be further baked to drive out solvent in the photo resist layer.

At S1403 of FIG. 14A, the photo resist layer is patterned using an EUV photo mask with a pellicle as set forth above, as shown in FIG. 14C. The patterning of the photo resist layer includes performing a photolithography exposing process by an EUV exposing system using the EUV mask. During the exposing process, the integrated circuit (IC) design pattern defined on the EUV mask is imaged to the photo resist layer to form a latent pattern thereon. The patterning of the photo resist layer further includes developing the exposed photo resist layer to form a patterned photo resist layer having one or more openings. In one embodiment where the photo resist layer is a positive tone photo resist layer, the exposed portions of the photo resist layer are removed during the developing process. The patterning of the photo resist layer may further include other process steps, such as various baking steps at different stages. For example, a post-exposure-baking (PEB) process may be implemented after the photolithography exposing process and before the developing process.

At S1404 of FIG. 14A, the target layer is patterned utilizing the patterned photo resist layer as an etching mask, as shown in FIG. 14D. In some embodiments, the patterning the target layer includes applying an etching process to the target layer using the patterned photo resist layer as an etch mask. The portions of the target layer exposed within the openings of the patterned photo resist layer are etched while the remaining portions are protected from etching. Further, the patterned photo resist layer may be removed by wet stripping or plasma etching, as shown in FIG. 14E.

Figure 15:
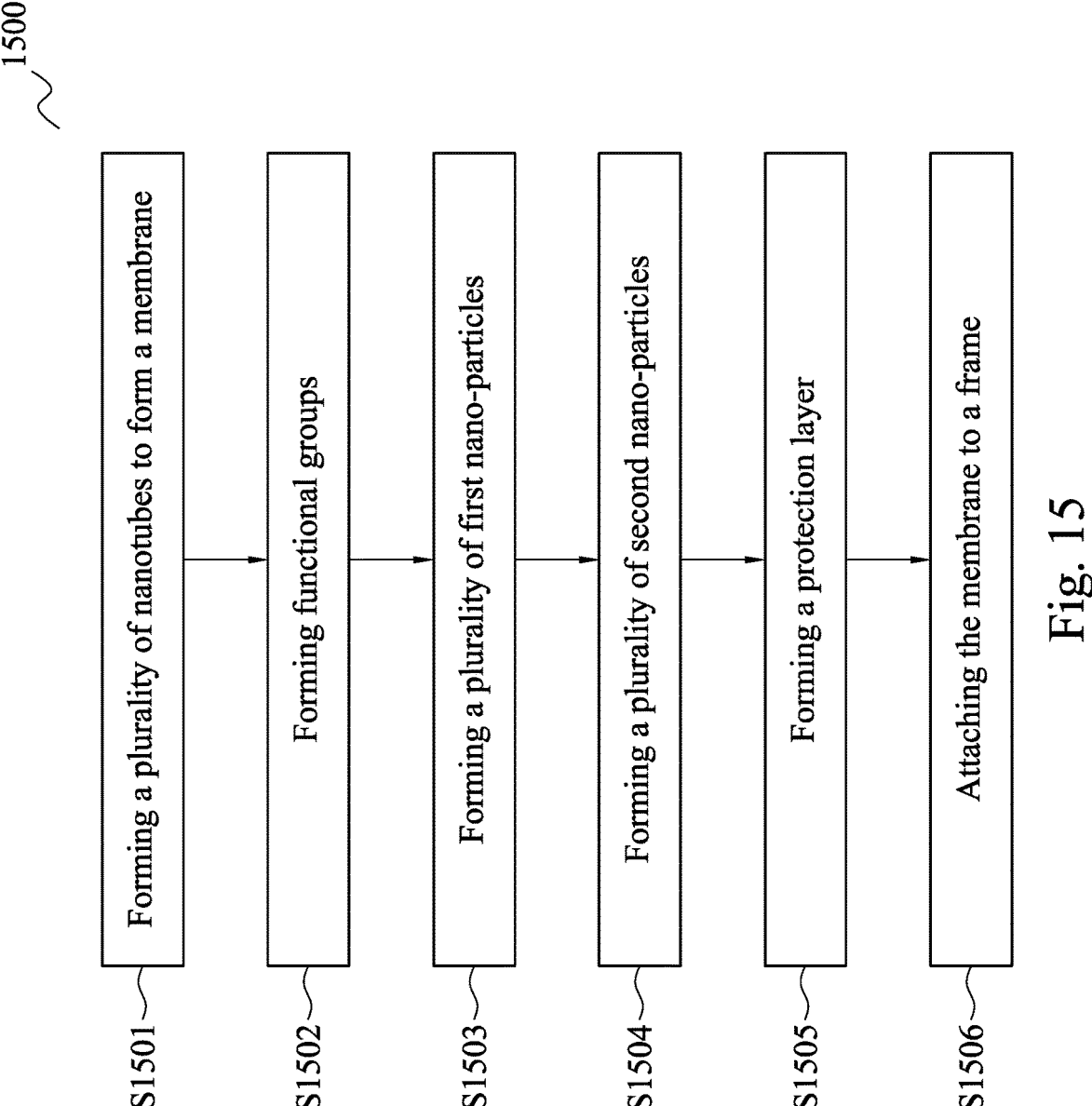
FIG. 15 shows a flowchart of a method of manufacturing a pellicle for an EUV photo mask in accordance with an embodiment of present disclosure.

FIG. 15 shows a flowchart of a method 1500 of manufacturing a pellicle for an EUV photo mask in accordance with an embodiment of present disclosure. As shown in FIGS. 1A and 1B, in some embodiments, a pellicle 1000 includes a frame 15 and a membrane 100 attached to the frame 15. As shown in FIG. 12E, in some embodiments, the membrane 100 includes a plurality of nanotubes 10 of a nanotube material, a plurality of Ru—O—X catalyst structures 20 partially covering a surface of each nanotube 10 of the plurality of nanotubes, and a protection layer 30 of a capping material to cover the plurality of Ru—O—X structures and the surface of each nanotube. In some embodiments, X is a metal element Mo, Ti and Zr, or Nb.

It is understood that additional operations can be provided before, during, and after the processes shown by FIG. 15, and some of the operations described below can be replaced or eliminated, for additional embodiments of the method. The order of the operations/processes may be interchangeable. Materials, configurations, methods, processes and/or dimensions as explained with respect to the foregoing embodiments are applicable to the following embodiments, and the detailed description thereof may be omitted.

At S1501 of FIG. 15, a plurality of nanotubes 10 of a nanotube material are formed, thereby forming a membrane 100. In some embodiments, the nanotube material is C, BN or hBN. As shown in FIGS. 9A-9C, in some embodiments, nanotubes 10 are formed by a CVD process using a furnace 900, thereby forming a membrane 100.

At S1502 of FIG. 15, as shown in FIG. 12A, functional groups 12 are dispersed on and partially cover a surface of each nanotube 10 of the plurality of nanotubes, thereby creating nucleation sites 12s on the surface of each nanotube 10 for nucleation or growth of the to-be-formed nanoparticles. In some embodiments, functional groups 12 includes OH functional groups (or hydroxyl groups).

At S1503 of FIG. 15, as shown in FIG. 12B, a plurality of first nano-particles 21 of a X-containing material (e.g., $MoO_2$) are formed at the nucleation sites 12s that are created by the functional groups 12 on the surface of each nanotube 10. In some embodiments, X is a metal element Mo, Ti, Zr, or Nb. In some embodiments, the X-containing material is selected from Mo, $MoO_2$, $MoO_3$, or a combination thereof. In some embodiments, the X-containing material is selected from Ti, $TiO_2$, TiN, or TiON, or a combination thereof. In some embodiments, the X-containing material is selected from Zr, $ZrO_2$, $ZrO_3$, or a combination thereof. As shown in FIG. 13A, in some embodiments, a plurality of first nanoparticles particles (such as $MoO_3$ particles) are deposited on the CNTs of a membrane 100 in an ALD chamber 1300A.

At S1504 of FIG. 15, as shown in FIG. 12C, a plurality of second nano-particles 22 of a Ru-containing material are formed on the plurality of first nano-particles 21, thereby forming a plurality of Ru—O—X catalyst structures 20 that advantageously resist hydrogen plasma attacks by efficiently reducing the attacking hydrogen ions in the EUV scanner. In some embodiments, the Ru-containing material is selected from Ru, $RuO_2$, $RuSi_2$, RuSi, $Ru_2Si_3$, or a combination thereof. As shown above in FIG. 13B, in some embodiments, a plurality of second nano-particles 22 of a Ru-containing material are deposited on the plurality of first nano-particles 21 of $MoO_3$ in an ALD chamber 1300B.

At S1505 of FIG. 15, as shown in FIG. 12E, a first protection layer 30 of a first capping material is formed to cover the plurality of Ru—O—X catalyst structures 20 and the surface of each nanotube 10, thereby protecting the Ru—O—X catalyst structures 20 and the nanotubes 10 of the membrane 100. In some embodiments, as shown in FIGS. 7A-7F, a second protection layer 32 of a second capping material is formed on the first protection layer 30. The second capping material is different from the first capping material, and is selected from SiN, SiON, AlN, $Y_2O_3$, $Al_2O_3$, YSiO, and SiC, or a combination thereof. In some embodiments, a first protection layer 30 (such as SiN) is deposited by an ALD deposition in an ALD chamber 1300C as shown in FIG. 13C. In some embodiments, a second protection layer 32 (such as SiC) is deposited by another ALD deposition in the same ALD chamber 1300C or in another ALD chamber.

At S1506 of FIG. 15, the membrane 100 made of nanotubes 10 is attached to a pellicle frame 15, thereby forming the pellicle 1000 (as shown in FIGS. 1A and 1B).

Figure 16:
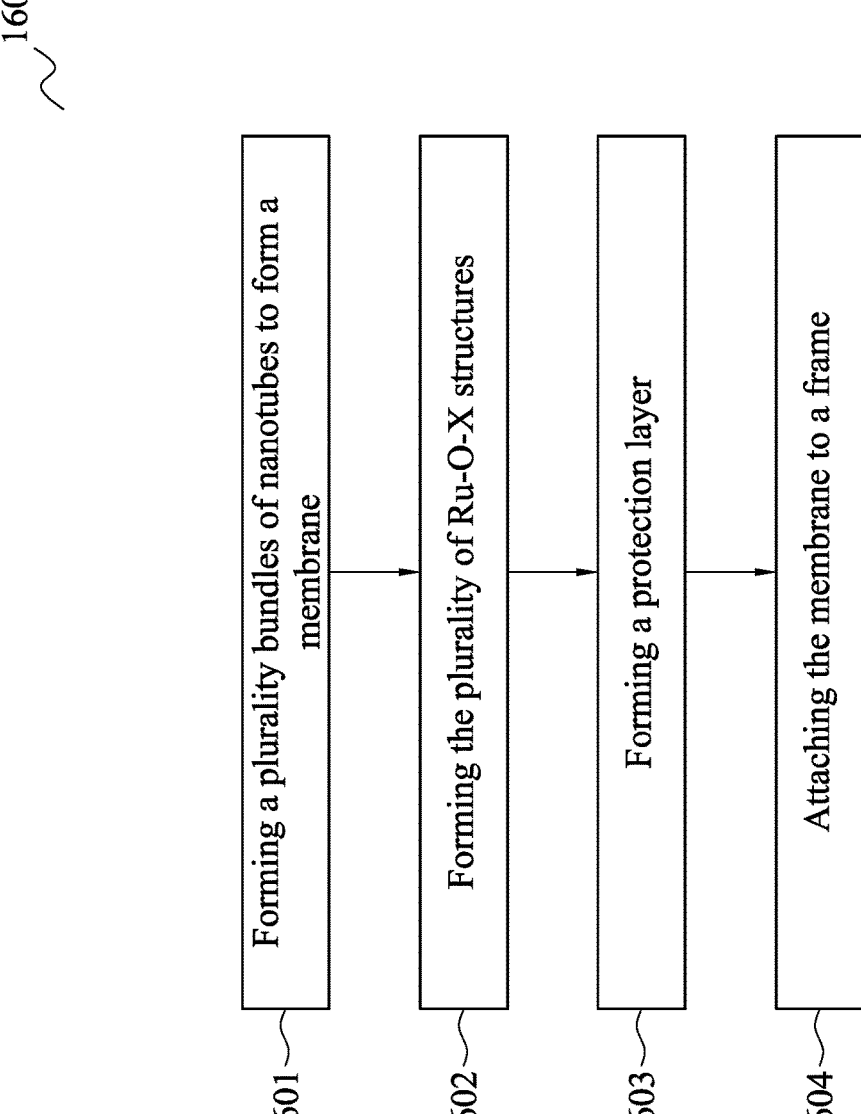
FIG. 16 shows a flowchart of a method of manufacturing a pellicle for an EUV photo mask in accordance with another embodiment of present disclosure.

FIG. 16 shows a flowchart of a method 1600 of manufacturing a pellicle for an EUV photo mask in accordance with another embodiment of present disclosure. It is understood that additional operations can be provided before, during, and after the processes shown by FIG. 16, and some of the operations described below can be replaced or eliminated, for additional embodiments of the method. The order of the operations/processes may be interchangeable. Materials, configurations, methods, processes and/or dimensions as explained with respect to the foregoing embodiments are applicable to the following embodiments, and the detailed description thereof may be omitted.

As shown in FIGS. 1A and 1B, in some embodiments, a pellicle 1000 includes a frame 15 and a membrane 100 attached to the frame 15. In some embodiments, the membrane 100 includes a plurality of nanotube bundles 10' of a nanotube material, a plurality of Ru—O—X catalyst structures 20 partially covering a surface of each nanotube bundle 10' of the plurality of nanotube bundles, and a protection layer 30 of a capping material covering the plurality of Ru—O—X catalyst structures 20 and the surface of each nanotube bundle 10'. In some embodiments, X is a metal element Mo, Ti, Zr or Nb.

At S1601 of FIG. 16, a plurality of nanotube bundles 10' of a nanotube material are formed. As shown in FIGS. 9A-9C, in some embodiments, a plurality of nanotubes 10 of the nanotube material and a membrane 100 are formed. As shown in FIGS. 10A-10B, in some embodiments, the membrane 100 along with nanotubes 10 (such as 10M) is thermally treated, and thus a plurality of nanotube bundles 10' are formed.

In some embodiments, after the plurality of nanotube bundles 10' are formed, functional groups 12 are dispersed on and partially cover the surface of each nanotube bundle 10', thereby creating nucleation sites 12s on the surface of each nanotube bundle 10' for nucleation or growth of the to-be-formed nano-particles.

At S1602 of FIG. 16, a plurality of Ru—O—X catalyst structures 20 are formed to partially cover a surface of each bundle of the plurality of bundles 10'. In some embodiments, X is a metal element Ru, Ti or Zr. In some embodiments, a plurality of first nano-particles 21 of a X-containing material are formed to partially cover the surface of each bundle 10', and a plurality of second nano-particles 22 of a Ru-containing material are formed on the plurality of first nano-particles 21, thereby forming the plurality of Ru—O—X catalyst structures 20 as shown in FIG. 12B.

In some embodiments, the plurality of first nano-particles 21 and the plurality of second nano-particles 22 are in the shapes or forms of nano-grains or nano-islands. In some embodiments, the X-containing material is Mo, $MoO_2$, $MoO_3$, or a combination thereof. In some embodiments, the X-containing material is Ti, $TiO_2$, TiN, TiON, or a combination thereof. In some embodiments, the X-containing material is Zr, $ZrO_2$, $ZrO_3$, or a combination thereof. In some embodiments, the Ru-containing material is Ru, $RuO_2$, $RuSi_2$, RuSi, $Ru_2Si_3$, or a combination thereof.

In some embodiments, after the plurality of Ru—O—X catalyst structures 20 are formed, the membrane 100 is annealed at a temperature from about 500° C. to about 1000° C., thereby forming interdiffusions 23 at interfaces between the plurality of first nano-particles 21 and the plurality of second nano-particles 22. The interdiffusions 23 advantageously further resist attacking particles (such as hydrogen particles H+) in the EUV scanner.

At S1603 of FIG. 16, a first protection layer 30 of a first capping material is formed to cover the plurality of Ru—O—X catalyst structures 20 and the surface of each bundle 10'. In some embodiments, the first capping material is SiN, SiON, AlN, $Y_2O_3$, $Al_2O_3$, YSiO, or SiC, or a combination thereof. In some embodiments, a second protection layer 32 of a second capping material is formed on the first protection layer 30. The second capping material is different from the first capping material, and is selected from SiN, SiON, AlN, $Y_2O_3$, $Al_2O_3$, YSiO, and SiC, or a combination thereof.

In some embodiments, after the first protection layer 30 is formed on the plurality of Ru—O—X catalyst structures 20 and the surface of each bundle 10', the first protection layer 30 is densified by applying an Ar plasma thereto. In other embodiments, after the first protection layer 30 and the second protection layer 32 are formed on the plurality of Ru—O—X catalyst structures 20 and the surface of each bundle 10', the first protection layer 30 and the second protection layer 32 are densified by applying an Ar plasma thereto. A densified protection layer can more efficiently protect the plurality of Ru—O—X catalyst structures 20 and the bundles 10' beneath thereof.

At S1604 of FIG. 16, the membrane 100 including nanotube bundles 10' is attached to a pellicle frame 15, thereby forming the pellicle 1000 (as shown in FIGS. 1A and 1B).

Figure 17:
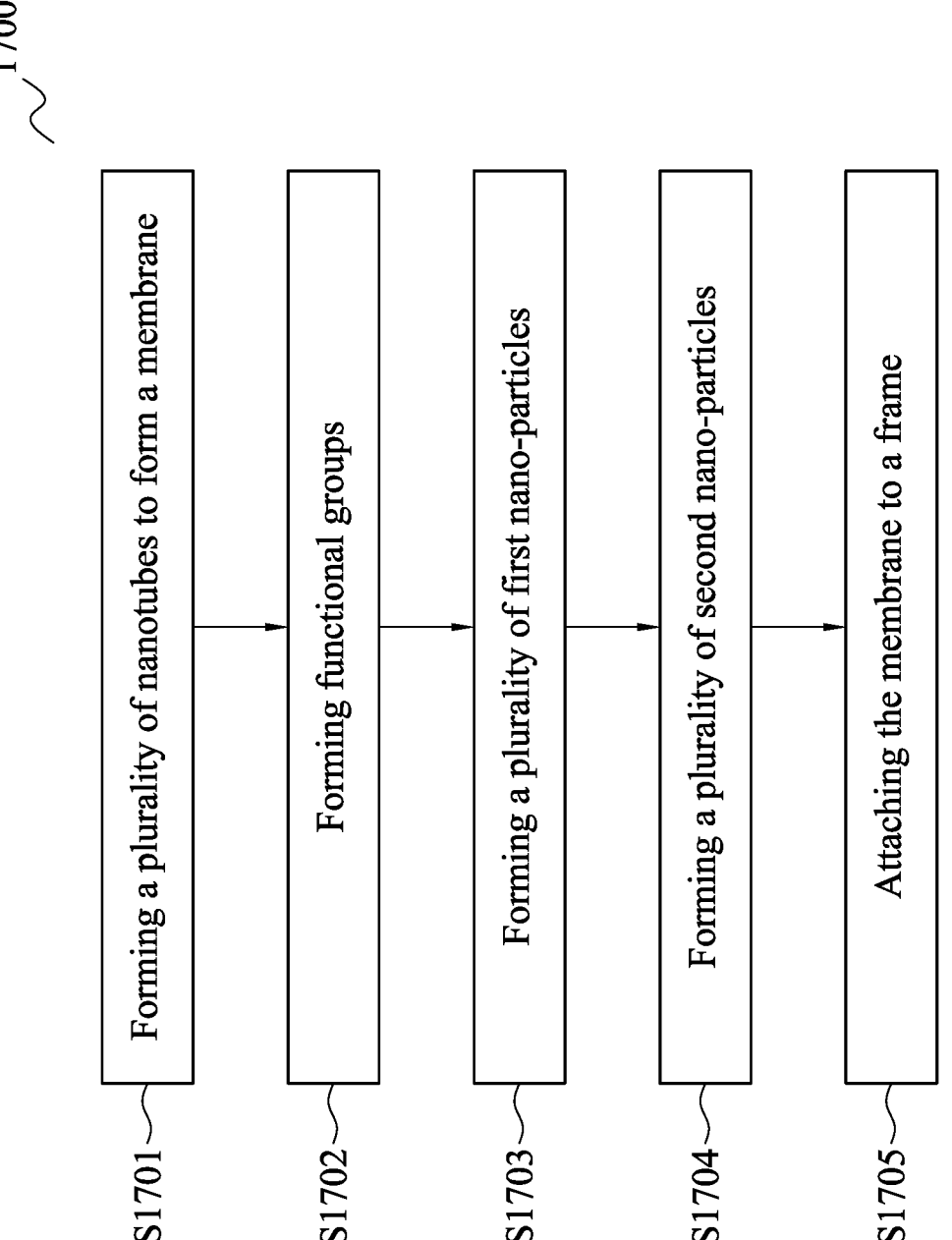
FIG. 17 shows a flowchart of a method of manufacturing a pellicle for an EUV photo mask in accordance with still another embodiment of present disclosure.

FIG. 17 shows a flowchart of a method 1700 of manufacturing a pellicle for an EUV photo mask in accordance with another embodiment of present disclosure. It is understood that additional operations can be provided before, during, and after the processes shown by FIG. 17, and some of the operations described below can be replaced or eliminated, for additional embodiments of the method. The order of the operations/processes may be interchangeable. Materials, configurations, methods, processes and/or dimensions as explained with respect to the foregoing embodiments are applicable to the following embodiments, and the detailed description thereof may be omitted.

At S1701 of FIG. 17, a plurality of nanotubes 10 of a nanotube material are formed, thereby forming a membrane 100. In some embodiments, the nanotube material is C, BN, or hBN. As shown in FIGS. 9A-9C, in some embodiments, nanotubes 10 are formed by a CVD process using a furnace 900, thereby forming a membrane 100.

At S1702 of FIG. 17, as shown in FIG. 12A, functional groups 12 are dispersed on and partially cover a surface of each nanotube 10 of the plurality of nanotubes, thereby creating nucleation sites 12s on the surface of each nanotube 10 for nucleation or growth of the to-be-formed nano-particles. In some embodiments, functional groups 12 includes OH functional groups (or hydroxyl groups).

At S1703 of FIG. 17, as shown in FIG. 12B, a plurality of first nano-particles 21 of a first material are formed at the nucleation sites 12s that are created by the functional groups 12 over the surface of each nanotube 10. In some embodiments, the first material is selected from Mo, $MoO_2$, $MoO_3$, or a combination thereof. In some embodiments, the first material is selected from Ti, $TiO_2$, TiN, or TiON, or a combination thereof. In some embodiments, the first material is selected from Zr, $ZrO_2$, $ZrO_3$, or a combination thereof.

At S1704 of FIG. 17, as shown in FIG. 12C, a plurality of second nano-particles 22 of a second material are formed in contact with the plurality of first nano-particles 21. In some embodiments, the second material is selected from Ru, $RuO_2$, $RuSi_2$, RuSi, $Ru_2Si_3$, or a combination thereof. Thus, a plurality of catalyst structures 20 (such as Ru—O—X catalyst structures, X being a metal element Mo, Ti or Zr) are formed in contact with the plurality of nanotubes 10, thereby advantageously efficiently reducing the attacking hydrogen particles in the EUV scanner.

At S1705 of FIG. 17, the membrane 100 made of nano-tubes 10 is attached to a pellicle frame 15, thereby forming the pellicle 1000 (as shown in FIGS. 1A and 1B).

In some embodiments, as shown in FIG. 12E, a first protection layer 30 of a first capping material is formed to cover the plurality of first nano-particles 21, the plurality of second nano-particles 22, and the nanotubes 10. In some embodiments, as shown in FIGS. 7A-8F, a second protection layer 32 of a second capping material is formed on the first protection layer 30. In some embodiments, the first and the second capping materials are different from each other, and are respectively selected from SiN, SiON, AlN, $Y_2O_3$, $Al_2O_3$, YSiO, and SiC, or a combination thereof.

Figure 18B:
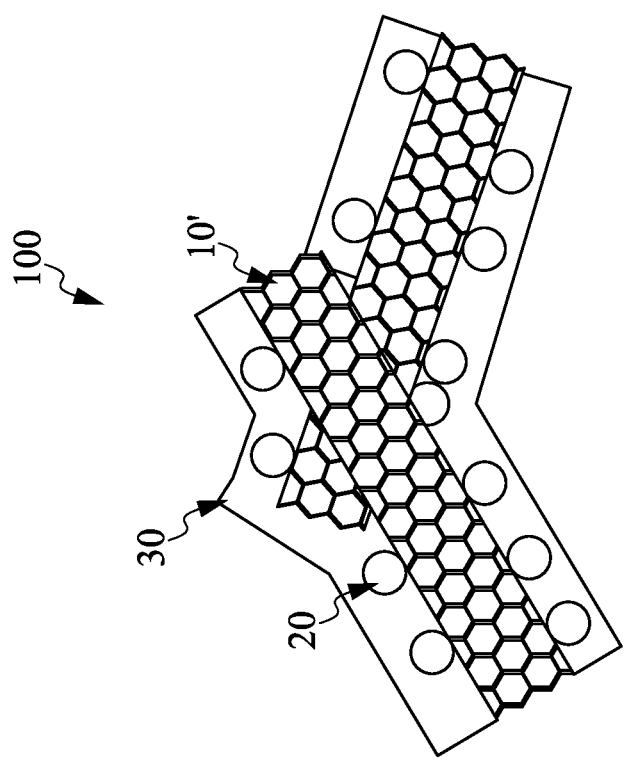
FIGS. 18A and 18B show structures of various membranes of a pellicle for an EUV photo mask in accordance with some embodiments of the present disclosure.
Figure 18A:
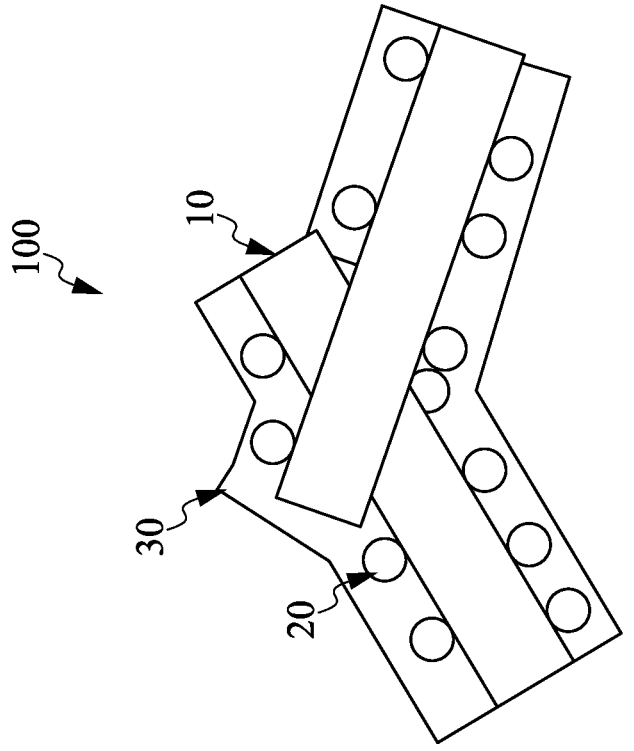

FIGS. 18A and 18B show structures of various membranes 100 of a pellicle for an EUV photo mask in accordance with some embodiments of the present disclosure. The Ru—O—X catalyst structures 20 include the plurality of first nano-particles 21 and the plurality of second nano-particles 22 in contact with each other. In some embodiments, as shown in FIG. 18A, Ru—O—X catalyst structures 20 are formed on and partially cover a surface fully wrapping around a nanotube 10, and a protection layer 30 of a capping material is formed fully wrapping around the nanotube 10 and the Ru—O—X catalyst structures 20 formed thereon. In other embodiments, as shown in FIG. 18B, Ru—O—X catalyst structures 20 are formed on and partially cover a surface fully wrapping around a nanotube bundle 10', and a protection layer 30 of a capping material is formed fully wrapping around the nanotube bundle 10' and the Ru—O—X catalyst structures 20 formed thereon. The same configurations of the Ru—O—X catalyst structures 20 and the protection layer 30 with respect to the nanotubes 10 or nanotube bundles 10' as shown in FIGS. 18A and/or 18B can be applied to any structures shown in FIGS. 3A-8F.

A pellicle for an EUV photo mask includes a membrane attached to a frame. The membrane includes nanotubes, Ru—O—X structures (X is a metal element Mo, Ti or Zr)

partially covering a surface of each nanotube, and a protection layer covering the Ru—O—X structures and the surface of each nanotube. The Ru—O—X structures include first nano-particles of a X-containing material formed on the nanotubes, and second nano-particles of a Ru-containing material formed on the first nano-particles. The membrane of the pellicle advantageously has good EUV light transmittance and improved endurance against attacking particles (such as hydrogen particles) in an EUV exposure environment, thereby having prolonged lifetime.

It will be understood that not all advantages have been necessarily discussed herein, no particular advantage is required for all embodiments or examples, and other embodiments or examples may offer different advantages.

In accordance with one aspect of the present disclosure, a method of manufacturing a pellicle for an extreme ultraviolet (EUV) photo mask includes: forming a plurality of nanotubes of a nanotube material to form a membrane; forming functional groups to partially cover a surface of each nanotube of the plurality of nanotubes; forming a plurality of first nano-particles of a first material over the plurality of nanotubes; forming a plurality of second nano-particles of a second material in contact with the plurality of first nano-particles; and attaching the membrane to a pellicle frame. In one or more of the foregoing and following embodiments, a first protection layer of a first capping material are formed to cover the plurality of first nano-particles, the plurality of second nano-particles, and the surface of each nanotube. In one or more of the foregoing and following embodiments, a second protection layer of a second capping material different from the first capping material are formed on the first protection layer. In one or more of the foregoing and following embodiments, the first capping material and the second capping material are respectively selected from the group consisting of SiN, SiON, AlN, $Y_2O_3$, $Al_2O_3$, YSiO, and SiC. In one or more of the foregoing and following embodiments, the first material is selected from the group consisting of Mo, $MoO_2$, and $MoO_3$, and the second material is selected from the group consisting of Ru, $RuO_2$, $RuSi_2$, RuSi, and $Ru_2Si_3$. In one or more of the foregoing and following embodiments, the first material is selected from the group consisting of Ti, $TiO_2$. TiN, and TiON, and the second material is selected from the group consisting of Ru, $RuO_2$, $RuSi_2$, RuSi, and $Ru_2Si_3$. In one or more of the foregoing and following embodiments, the first material is selected from the group consisting of Zr, $ZrO_2$, and $ZrO_3$, and the second material is selected from the group consisting of Ru, $RuO_2$, $RuSi_2$, RuSi, and $Ru_2Si_3$.

In accordance with one aspect of the present disclosure, a method of manufacturing a pellicle for an extreme ultraviolet (EUV) photo mask incudes: forming a plurality of bundles of nanotubes of a nanotube material to form a membrane; forming a plurality of Ru—O—X structures to partially cover a surface of each bundle of the plurality of bundles, X being a metal element selected from a group consisting of Ru, Ti and Zr; forming a protection layer of a capping material to cover the plurality of Ru—O—X structures and the surface of each bundle; and attaching the membrane to a pellicle frame. In one or more of the foregoing and following embodiments, forming the plurality of Ru—O—X structures includes: forming a plurality of first nano-particles of a X-containing material to partially cover the surface of each bundle; and forming a plurality of second nano-particles of a Ru-containing material on the plurality of first nano-particles. In one or more of the foregoing and following embodiments, the plurality of first nano-particles and the plurality of second nano-particles are nano-grains or nano-islands. In one or more of the foregoing and following embodiments, the method further includes: forming functional groups on the surface of each bundle before forming the plurality of Ru—O—X structures, wherein the plurality of Ru—O—X structures are formed at sites of the functional groups on the surface of each bundle. In one or more of the foregoing and following embodiments, the method further includes after forming the plurality of Ru—O—X structures, annealing the membrane at a temperature from about 500° C. to about 1000° C. to form interdiffusions at interfaces between the plurality of first nano-particles and the plurality of second nano-particles. In one or more of the foregoing and following embodiments, the method further includes densifying the protection layer by applying an Ar plasma thereto.

In accordance with one aspect of the present disclosure, a pellicle for an extreme ultraviolet (EUV) photo mask includes: a frame; and a membrane attached to the frame. The membrane includes: a plurality of nanotubes of a nanotube material; a plurality of Ru—O—X structures partially covering a surface of each nanotube of the plurality of nanotubes, wherein X is a metal element selected from a group consisting of Mo, Ti and Zr; and a protection layer of a capping material to cover the plurality of Ru—O—X structures and the surface of each nanotube. In one or more of the foregoing and following embodiments, the plurality of Ru—O—X structures include a plurality of first nano-particles of a X-containing material to partially cover the surface of each nanotube, and a plurality of second nano-particles of a Ru-containing material formed on the plurality of first nano-particles. In one or more of the foregoing and following embodiments, the membrane includes first interdiffusions at first interfaces of the plurality of first nano-particles and the plurality of second nano-particles. In one or more of the foregoing and following embodiments, the membrane includes second interdiffusions at second interfaces of the plurality of first nano-particles and the protection layer. In one or more of the foregoing and following embodiments, at least one of the plurality of Ru—O—X structures protrudes from the protection layer. In one or more of the foregoing and following embodiments, the capping material is selected from a group consisting of SiN, SiON, AlN, $Y_2O_3$, $Al_2O_3$, YSiO, and SiC. In one or more of the foregoing and following embodiments, the protection layer includes two or more sub-protection layers of different capping materials respectively selected from a group consisting of SiN, SION, AlN, $Y_2O_3$, $Al_2O_3$, YSiO, and SiC.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a pellicle for an extreme ultraviolet (EUV) photo mask, comprising:
   forming a plurality of nanotubes made of a nanotube material to form a membrane;
   forming functional groups to at least partially cover a surface of each nanotube of the plurality of nanotubes;

forming a plurality of first nano-particles made of a first material over the plurality of nanotubes;
   forming a plurality of second nano-particles made of a second material in contact with the plurality of first nano-particles;
   forming a first protection layer made of a first capping material to cover the plurality of first nano-particles, the plurality of second nano-particles, and the surface of each nanotube; and
   attaching the membrane to a pellicle frame.

2. The method of claim 1, wherein the first material is selected from the group consisting of Mo, $MoO_2$, and $MoO_3$, and wherein the second material is selected from the group consisting of Ru, $RuO_2$, $RuSi_2$, RuSi, and $Ru_2Si_3$.

3. The method of claim 1, wherein the first material is selected from the group consisting of Ti, $TiO_2$, TiN, and TION, and wherein the second material is selected from the group consisting of Ru, $RuO_2$, $RuSi_2$, RuSi, and $Ru_2Si_3$.

4. The method of claim 1, wherein the first material is selected from the group consisting of Zr, $ZrO_2$, and $ZrO_3$, and wherein the second material is selected from the group consisting of Ru, $RuO_2$, $RuSi_2$, RuSi, and $Ru_2Si_3$.

5. The method of claim 1, wherein the first material is selected from the group consisting of Nb, NbO, $NbO_2$, $Nb_2O_5$, and wherein the second material is selected from the group consisting of Ru, $RuO_2$, $RuSi_2$, RuSi, and $Ru_2Si_3$.

6. The method of claim 1, further comprising:
   forming a second protection layer made of a second capping material different from the first capping material on the first protection layer.

7. The method according to claim 1, wherein the first capping material is selected from the group consisting of SiN, SiON, AlN, $Y_2O_3$, $Al_2O_3$, YSiO, and SiC.

8. A method of manufacturing a pellicle for an extreme ultraviolet (EUV) photo mask, comprising:
   forming a plurality of bundles of nanotubes made of a nanotube material to form a membrane;
   forming a plurality of Ru—O—X catalyst structures to at least partially cover a surface of each bundle of the plurality of bundles, X being a metal element selected from the group consisting of Ru, Ti and Zr;
   forming a protection layer of a capping material to cover the plurality of Ru—O—X structures and the surface of each bundle; and
   attaching the membrane to a pellicle frame.

9. The method of claim 8, wherein forming the plurality of Ru—O—X structures comprising:
   forming a plurality of first nano-particles made of a X-containing material to partially cover the surface of each bundle; and
   forming a plurality of second nano-particles made of a Ru-containing material on the plurality of first nano-particles.

10. The method of claim 9, wherein the plurality of first nano-particles and the plurality of second nano-particles are nano-grains or nano-islands.

11. The method of claim 8, further comprising:
   forming functional groups on the surface of each bundle before forming the plurality of Ru—O—X structures, wherein the plurality of Ru—O—X structures are formed at sites of the functional groups on the surface of each bundle.

12. The method of claim 8, further comprising:
   after forming the plurality of Ru—O—X structures, annealing the membrane at a temperature from about 500° C. to about 1000° C. to form interdiffusions at interfaces between the plurality of first nano-particles and the plurality of second nano-particles.

13. The method of claim 8, further comprising:

densifying the protection layer by applying an Ar plasma thereto.

14. A pellicle for an extreme ultraviolet (EUV) photo mask, comprising:

a frame; and a membrane attached to the frame, wherein the membrane comprises:

a plurality of nanotubes made of a nanotube material;

a plurality of Ru—O—X catalyst structures at least partially covering a surface of each nanotube of the plurality of nanotubes, wherein X is a metal element selected from the group consisting of Mo, Ti, Nb, and Zr; and a protection layer made of a capping material to cover the plurality of Ru—O—X structures and the surface of each nanotube.

15. The pellicle of claim 14, wherein the plurality of Ru—O—X catalyst structures comprise a plurality of first nano-particles made of a X-containing material to partially cover the surface of each nanotube, and a plurality of second nano-particles made of a Ru-containing material formed on the plurality of first nano-particles.

16. The pellicle of claim 15, wherein the membrane comprises first interdiffusions at first interfaces of the plurality of first nano-particles and the plurality of second nano-particles.

17. The pellicle of claim 15, wherein the membrane comprises second interdiffusions at second interfaces of the plurality of first nano-particles and the protection layer and third interdiffusions at third interfaces of the plurality of second nano-particles and the protection layer.

18. The pellicle of claim 14, wherein at least one of the plurality of Ru—O—X catalyst structures protrudes from the protection layer, and wherein the plurality of nanotubes are dispersed in a specific orientation or randomly dispersed.

19. The pellicle of claim 14, wherein the capping material is selected from the group consisting of SiN, SiON, AlN, $Y_2O_3$, $Al_2O_3$, YSiO, and SiC.

20. The pellicle of claim 14, wherein the protection layer comprises two or more sub-protection layers of different capping materials respectively selected from the group consisting of SiN, SiON, AlN, $Y_2O_3$, $Al_2O_3$, YSiO, and SiC.

* * * * *